US007060419B2

(12) United States Patent
Bentsen et al.

(10) Patent No.: US 7,060,419 B2
(45) Date of Patent: Jun. 13, 2006

(54) PROCESS FOR PRODUCING MICROFLUIDIC ARTICLES

(75) Inventors: James G. Bentsen, North St. Paul, MN (US); Robert J. DeVoe, Oakdale, MN (US); Todd R. Williams, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 150 days.

(21) Appl. No.: 10/297,962

(22) PCT Filed: Jun. 14, 2001

(86) PCT No.: PCT/US01/19180

§ 371 (c)(1),
(2), (4) Date: Dec. 12, 2002

(87) PCT Pub. No.: WO01/96958

PCT Pub. Date: Dec. 20, 2001

(65) Prior Publication Data

US 2004/0042937 A1    Mar. 4, 2004

Related U.S. Application Data

(60) Provisional application No. 60/211,707, filed on Jun. 15, 2000.

(51) Int. Cl.
*B29C 35/08* (2006.01)
*B29C 33/42* (2006.01)
*C08F 2/46* (2006.01)

(52) U.S. Cl. .................. 430/320; 430/322; 430/270.1; 430/296; 264/494; 522/6

(58) Field of Classification Search ............. 430/270.1, 430/296, 322; 264/494; 522/6
See application file for complete search history.

(56) References Cited

U.S. PATENT DOCUMENTS

| | | |
|---|---|---|
| 3,018,262 A | 1/1962 | Schroeder |
| 3,117,099 A | 1/1964 | Proops et al. |
| 3,635,545 A | 1/1972 | VanKerkhove et al. |
| 3,720,921 A | 3/1973 | Schools et al. |
| 3,729,313 A | 4/1973 | Smith |
| 3,741,769 A | 6/1973 | Smith |
| 3,758,186 A | 9/1973 | Brumm |
| 3,779,778 A | 12/1973 | Smith et al. |
| 3,806,221 A | 4/1974 | Kiemle |
| 3,808,006 A | 4/1974 | Smith |
| 3,954,475 A | 5/1976 | Bonham et al. |
| 3,987,037 A | 10/1976 | Bonham et al. |
| 4,041,476 A | 8/1977 | Swainson |
| 4,078,229 A | 3/1978 | Swanson et al. |
| 4,228,861 A | 10/1980 | Hart |
| 4,238,840 A | 12/1980 | Swainson |
| 4,250,053 A | 2/1981 | Smith |
| 4,279,717 A | 7/1981 | Eckberg et al. |
| 4,288,861 A | 9/1981 | Swainson et al. |
| 4,333,165 A | 6/1982 | Swainson et al. |
| 4,394,403 A | 7/1983 | Smith |
| 4,394,433 A | 7/1983 | Gatzke |
| 4,458,345 A | 7/1984 | Bjorklund et al. |
| 4,466,080 A | 8/1984 | Swainson et al. |
| 4,471,470 A | 9/1984 | Swainson et al. |
| 4,491,628 A | 1/1985 | Ito et al. |
| 4,496,216 A | 1/1985 | Cowan |
| 4,547,037 A | 10/1985 | Case |
| 4,588,664 A | 5/1986 | Fielding et al. |
| 4,642,126 A | 2/1987 | Zador et al. |
| 4,652,274 A | 3/1987 | Boettcher et al. |
| 4,666,236 A | 5/1987 | Mikami et al. |
| 4,775,754 A | 10/1988 | Vogel et al. |
| 4,859,572 A | 8/1989 | Farid et al. |

(Continued)

FOREIGN PATENT DOCUMENTS

DE          41 42 327        6/1993

(Continued)

OTHER PUBLICATIONS

R. D. Allen, G. M. Wallraff, W. D. Hinsberg, and L. L. Simpson in *High Performance Acrylic Polymers for Chemically Amplified Photoresist Applications, J. Vac. Sci. Technol.* B, 9, 3357 (1991).
C. Xu and W. W. Webb in *J. Opt. Soc. Am. B*, 13, 481 (1996).
R. D Allen et al. in *Proc. SPIE* 2438, 474 (1995).
I. B. Berlman in *Handbook of Fluorescence Spectra of Aromatic Molecules*, Second Edition, pp. 24-27, Academic Press, New York (1971).
J. N. Demas and G. A. Crosby in *J. Phys. Chem.* 75, 991-1024 (1971).
J. V. Morris, M. A. Mahoney, and J. R. Huber in *J. Phys. Chem.* 80, 969-974 (1976).

(Continued)

*Primary Examiner*—John A. McPherson
*Assistant Examiner*—Daborah Chacko-Davis
(74) *Attorney, Agent, or Firm*—Lucy C. Weiss

(57) ABSTRACT

A process for producing microfluidic articles comprises (a) preparing a photoreactive composition comprising (1) at least one reactive species that is a polymer or a polymer precursor and that is capable of undergoing an acid- or radical-initiated chemical reaction and (2) at least one multiphoton photoinitiator system; (b) exposing a portion of the composition to light sufficient to cause simultaneous absorption of at least two photons, thereby forming exposed and unexposed portions of the composition, and thereby inducing at least one acid- or radical-initiated chemical reaction in the exposed portion; and (c) removing either the exposed or the unexposed portion of the composition, so as to form a microfluidic article comprising a seamless polymer matrix that defines at least one inlet, at least one outlet, and a microfluid processing architecture that is capable of fluidic communication with the inlet and the outlet and that is otherwise fully enclosed within the polymer matrix.

27 Claims, 1 Drawing Sheet

U.S. PATENT DOCUMENTS

| | | | |
|---|---|---|---|
| 4,877,717 A | 10/1989 | Suzuki et al. | |
| 4,963,471 A | 10/1990 | Trout et al. | |
| 5,006,746 A | 4/1991 | Kasuga et al. | |
| 5,034,613 A | 7/1991 | Denk et al. | |
| 5,037,917 A | 8/1991 | Babb et al. | |
| 5,145,942 A | 9/1992 | Hergenrother et al. | |
| 5,159,037 A | 10/1992 | Clement et al. | |
| 5,159,038 A | 10/1992 | Babb et al. | |
| 5,225,918 A | 7/1993 | Taniguchi et al. | |
| 5,235,015 A | 8/1993 | Ali et al. | |
| 5,283,777 A | 2/1994 | Tanno et al. | |
| 5,289,407 A | 2/1994 | Strickler et al. | |
| 5,405,733 A | 4/1995 | Sirkin et al. | |
| 5,422,753 A | 6/1995 | Harris | |
| 5,446,172 A | 8/1995 | Crivello et al. | |
| 5,478,869 A | 12/1995 | Takahashi et al. | |
| 5,479,273 A | 12/1995 | Ramsbottom | |
| 5,529,813 A | 6/1996 | Kobsa et al. | |
| 5,545,676 A | 8/1996 | Palazzotto et al. | |
| 5,665,522 A | 9/1997 | Vogel et al. | |
| 5,703,140 A | 12/1997 | Kunita et al. | |
| 5,747,550 A | 5/1998 | Nohr et al. | |
| 5,750,641 A | 5/1998 | Ezzell et al. | |
| 5,753,346 A | 5/1998 | Leir et al. | |
| 5,759,721 A | 6/1998 | Dhal et al. | |
| 5,759,744 A | 6/1998 | Brueck et al. | |
| 5,770,737 A | 6/1998 | Reinhardt et al. | |
| 5,847,812 A | 12/1998 | Ooki et al. | |
| 5,854,868 A | 12/1998 | Yoshimura et al. | |
| 5,856,373 A | 1/1999 | Kaisaki et al. | |
| 5,859,251 A | 1/1999 | Reinhardt et al. | |
| 5,864,412 A | 1/1999 | Wilde | |
| 5,952,152 A | 9/1999 | Cunningham et al. | |
| 5,998,495 A | 12/1999 | Oxman et al. | |
| 6,005,137 A | 12/1999 | Moore et al. | |
| 6,025,406 A | 2/2000 | Oxman et al. | |
| 6,025,938 A | 2/2000 | Kathman et al. | |
| 6,030,266 A | 2/2000 | Ida et al. | |
| 6,043,913 A | 3/2000 | Lu et al. | |
| 6,048,911 A | 4/2000 | Shustack et al. | |
| 6,051,366 A | 4/2000 | Baumann et al. | |
| 6,100,405 A | 8/2000 | Reinhardt et al. | |
| 6,103,454 A | 8/2000 | Dhar et al. | |
| 6,107,011 A | 8/2000 | Gelbart | |
| 6,215,095 B1 | 4/2001 | Partanen et al. | |
| 6,262,423 B1 | 7/2001 | Hell et al. | |
| 6,267,913 B1 | 7/2001 | Marder et al. | |
| 6,297,910 B1 | 10/2001 | Xuan et al. | |
| 6,312,876 B1 | 11/2001 | Huang et al. | |
| 6,316,153 B1 | 11/2001 | Goodman et al. | |
| 6,322,931 B1 | 11/2001 | Cumpston et al. | |
| 6,322,933 B1 | 11/2001 | Daiber et al. | |
| 6,441,356 B1 | 8/2002 | Mandella et al. | |
| 6,541,591 B1 | 4/2003 | Olson et al. | |
| 6,608,228 B1* | 8/2003 | Cumpston et al. | 564/308 |
| 6,624,915 B1 | 9/2003 | Kirkpatrick et al. | |
| 6,703,188 B1 | 3/2004 | Kagami et al. | |
| 6,750,266 B1 | 6/2004 | Bentsen et al. | |
| 2002/0034693 A1 | 3/2002 | Fukuda et al. | |
| 2004/0067431 A1 | 4/2004 | Arney et al. | |
| 2005/0009175 A1* | 1/2005 | Bergh et al. | 435/287.2 |

FOREIGN PATENT DOCUMENTS

| | | |
|---|---|---|
| DE | 42 19 376 | 12/1993 |
| DE | 19653413 | 6/1998 |
| JP | 62-097791 | 5/1987 |
| WO | WO 92/00185 | 1/1992 |
| WO | WO 97/27519 | 7/1997 |
| WO | WO 98/21521 | 5/1998 |
| WO | WO 99/23650 | 5/1999 |
| WO | WO 99/53242 | 10/1999 |
| WO | WO 99/54784 | 10/1999 |
| WO | WO 02/079691 | 10/2002 |

OTHER PUBLICATIONS

*Bull. Chem. Soc.* Japan, 42, 2924-2930 (1969).

R. J. Cox, *Photographic Sensitivity*, Academic Press (1973), R.J. Cox, ed., pp. 241-263.

D. F. Eaton in *Advances in Photochemistry*, B. Voman et al., vol. 13, pp. 427-488, (1986).

Beringer et al., *J. Am. Chem. Soc. 81*, 342 (1959).

Makukha et al., *Two-Photon-Excitation Spatial Distribution for Cross Focused Gaussian Beams, Applied Optics*, vol. 40, No. 23, pp. 3932-3936 (Aug. 10, 2001).

Bunning et al. *Electronically Switchable Grating Formed Using Ultrafast Holographic Two-Photon-Induced Photopolymerization, Chem. Mater.*, 2000, 12 pp. 2842-2844.

Diamond et al., *Two-Photon Holography in 3-D Photopolymer Host-Guest Matrix, Optics Express*, vol. 6, No. 3, Jan. 31, 2000, pp. 64-68.

Diamond et al., *Two-Photon Holography in 3-D Photopolymer Host-Guest Matrix: errata ,Optic Express*, vol. 6, No. 4, Feb. 14, 2000, pp. 109-110.

Ashley et al., *Holographic Data Storage, IBM J. Res. Develop.* vol. 44, No. 3, May 2000, pp. 341-368.

Belfield et al., *Near-IR Two-Photon Photoinitiated Polymerization Using a Fluorone/Amine Initiating System, J. Am. Chem. Soc.*, 2000, 122 pp. 1217-1218.

Campagnola et al., *3-Dimensional Submicron Polymerization of Acrylamide By Multiphoton Excitation of Xanthene Dyes, Macromolecules*, 2000, vol. 33, pp. 1511-1513.

Hong-Bo Sun et al., *Three-dimensional Photonic Crystal Structures Achieved With Two-Photon-Absorption Photopolymerization of Material, Applied Physics Letters*, vol. 74, No. 6, Feb. 8, 1999, pp. 786-788.

Cumpston et. al. *Two-Photon Polymerization Initiators For Three-Dimensional Optical Data Storage and Microfabrication, Nature*, vol. 398, Mar. 4, 1999, pp. 51-54.

Joshi et al., *Three-dimensional Optical Circuitry Using Two-Photo-Assisted Polymerization, Applied Physics Letters*, vol. 74, No. 2, Jan. 11, 1999, pp. 170-172.

Bunning et al., *Electrically Switchable Grating Formed Using Ultrafast Holographic Two-Photon-Induced Photopolymerization, Chem. Mater.* 2000, vol. 12, pp. 2842-2844.

Kirkpatrick et al. *Holographic Recording Using Two-Photon-Induced Photopolymerization, Appl. Phys. A*, vol. 69, pp. 461-464, 1999.

Maruo s et al., *Movable Microstructures made by Two-Photon Three-Dimensional Microfabrication*, 1999 International Symposium on Micromechatronics and Human Science, vol. 23, pp. 173-178 XP002191032.

Kuebler S M et al., *Three-Dimensional Microfabrication Using Two-Photon Activated Chemistry, SPIE* vol. 3937, pp. 97-105, Jan. 27, 2000 XP008000209.

Cumpston B H et al., *New Photopolmers Based on Two-Photon Absorbing Chromophores and Application to Three-Dimensional Microfabrication and Optical Storage, Mat. Res. Soc. Symp. Proc.*, vol. 488, pp. 217-225, 1998, XP008000191.

Kawata S. et al., *Photon-Iduces Micro/Nano Fabrication, Manipulation and Imaging with Unconvential Photo-Active Systems, Mol. Cryst. Liq. Cryst.*, vol. 314, pp. 173-178, Aug. 25, 1997, XP001059839.

Tanaka et al., *Three-Dimensional Fabrication and Observation of Micro-Structures Using Two-Photon Absorption and Fluorescence*, SPIE, vol. 3937, pp. 92-96, Jan. 27, 2000, XP001051866.

Wenseleers et al., *Five Orders-of-Magnitude Enhancement of Two-Photon Absorption for Dyes On Silver Nanoparticle Fractal Clusters*, J. Phys. Chem. B, vol. 106, pp. 6853-6863, 2002.

Zhou et al., *Efficient Photacids Based Upon Triarylamine Dialkylsulfonium Salts*, J. Am. Chem. Soc., vol. 124, No. 9, pp. 1897-1901.

Zhou et al., *An Efficient Two-Photon-Generated Photoacid Applied To Positive-Tone 3D Microfabrication*, Science, vol. 296, pp. 1106-1109, May 10, 2002.

Stellacci et al., *Laser and Electron-Beam Induced Growth of Nanoparticles for 2D and 3D Metal Patterning*, Adv. Mater., vol. 14, No. 3, pp. 194-198, Feb. 2002.

Watanabe et al., *Photoreponsive Hydrogel Microstructure Fabricated by Two-Photon Initiated Polymerization*, Adv. Func. Mater., vol. 12, No. 9, pp. 611-614, Sep. 2002.

Hong-Bo Sun, *Real Three-Dimensional Microstructures Fabricated By Photpolymerization of Resins Through Two-Photon Absorption*, Optical Letters, vol. 25, No. 5, pp. 1110-1112, Aug. 2000.

Misawa et al., *Microfabrication By Femtosecond Laser Irradiation*, SPIE,, vol. 3933, pp. 246-260, 2000.

Miwa, *Femtosecond Two-Photon Stereo-Lithography*, Applied Physics A, vol. 73, No. 5, pp. 561-566, 2001.

Kawata et al., *Two-Photon Photopolymerization of Functional Micro-Devices*, Journal of Photopolymer Science and Technology, vol. 15, No. 3, pp. 471-474, 2002.

Boiko et al., *Thresold Enhancement in Two-Photon Photopolymerization*, SPIE, vol. 4097, pp. 254-263, 2000.

Belfield et al., *Multiphoton-Absorbing Organic Materials For Microfabrication*, emerging Optical Applications and Non-Destructive Three-Dimensional Imaging, J. Phys. Org., vol. 13, pp. 837-849, 2000.

Serbin et al., *Femtosecond Laser-Induced Two-Photon Polymerization of Inorganic-Organic Hybrid Materials for Applications in Photonics*, Optics Letters, vol. 28, No. 5, pp. 301-303, Mar. 2003.

Davidson, *The Chemistry of Photoinitiators Some Recent Developments*, J. Photochem. Photobiol. A., vol. 73, pp. 81-96, 1993.

Dektar et al., *Photochemistry of Triarylsulfonium Salts*, J. Am. Chem. Soc., vol. 112, pp. 6004-6015, 1990.

Denk et al., *Two-Photon Laser Scanning Fluorescence Microscopy*, Science, vol. 248, pp. 73-76, Apr. 1990.

Dvornikov et al., *Two-Photon Three-Dimensional Optical Storage Memory*, Advances in Chemistry Series, vol. 240, pp. 161-177, 1994.

Goppert-Mayer, *Uber Elmentarakte Mit zwei Quantesprungen*, Ann. Phys., vol. 9, pp. 273-294, 1931.

Ito, *Chemical Amplification Resists: History and Development Within IBM*, IBM J. Res. Develop., vol. 41, No. 1 / 2, pp. 69-80, Mar. 1997.

Jenkins et al., *Fundamentals of Optics*, 3rd Edition, McGraw-Hill, New York, pp. 331, 1957.

Kavarnos et al., *Photosensitization By Reversible Electron Transfer : Theories, Experimental Evidence, and Examples*, Chem. Rev., vol. 86, pp. 401-449, Apr. 1986.

Kennedy et al., *p-Bis(o-methylstyryl) benzene as a Power-Squared Sensor for Two-Photon Absorption Measurements between 537 and 694 nm*, Anal. Chem., vol. 58, pp. 2643-2647, 1986.

Kewitsch et al., *Self-Focusing and Self-Trapping of Optical Beams Upon Photopolymerization*, Optics Letters, vol. 21, No. 1, pp. 24-26, Jan. 1996.

Lee et al., *Micromachining Applications of a High Resolution Ultrathick Photoresist*, J. Vac. Sci. Technol. B, vol. 13, pp. 3012-3016, Dec. 1995.

Lipson et al., *Nature of the Potential Energy Surfaces for the Sn1 Reaction A Picosecond Kinetic Study of Homolysis and Heterolysis for Diphenylmethyl Chlorides*, J. Am. Chem. Soc., vol. 118, pp. 2992-2997, 1996.

Lorenz et al., *SU-8: a low cost negative resist for MEMS*, J. Micromech. Microeng. , vol. 7, pp. 121-124, 1997.

Maiti et al., *Measuring Serotonin Distribution in Live Cells with Three-Photon Excitation*, Science, vol. 275, pp. 530-532, Jan. 1997.

March, *Advanced Organic Chemistry: Reactions, Mechanisms and Structure*, Four Edition, 1992, Wiley-Interscience, New York, p. 205.

March, *Advanced Organic Chemistry: Reactions, Mechanisms and Structure*, Four Edition, 1992, Wiley-Interscience, New York, Chapter 2.

March, *Advanced Organic Chemistry: Reactions, Mechanisms and Structure*, Four Edition, 1992, Wiley-Interscience, New York, Chapter 9.

Maruo et al., *Two-Photon-Absorbed Photopolymerization for Three-Dimensional Microfabrication*, IEEE, The Tenth Annual International Workshop on Micro Electro Mechanical Systems, pp. 169-174, 1997.

Maruo et al., *Three-Dimensional Microfabrication With Two-Photon-Absorbed Photopolymerization*, Optics Letters, vol. 22, No. 2, pp. 132-134, Jan. 1997.

McClelland et al., *Laser Flash Photolysis of 9-Fluorenol. Production and Reactivities of the 9-Fluorenol Radical Cation and the 9-Fluorenyl Cation*, J. Am. Chem. Soc., vol. 112, pp. 4857-4861, 1990.

McClelland et al., *Flash Photolysis Study of a Friedel-Crafts alkylation. Reaction of the Photogenerated 9-Fluorenyl cation with aromatic compounds*, J. Chem. Soc., vol. 2, pp. 1531-1543, 1996.

Odian, *Principles of Polymerization Second Edition* John Wiley & Sons, New York, 1981, pp. 181.

Richardson, *Langmuir-Blodgett Films, An Introduction to Molecular Electronics*, Chapter 10, 1995.

Pitts et al., *Submicro Multiphoton Free-Form Fabrication of Proteins and Polymers : Studies of Reaction Efficiencies and Applications in Sustained Release*, Macromolecules, vol. 33, pp. 1514-1523, 2000.

He et al., *Two-Photon Absorption and Optical-Limiting Properties of Novel Organic Compounds*, Optics Letters, vol. 20, No. 5, pp. 435-437, Mar. 1995.

Parthenopoulos et al., *Three-Dimensional Optical Storage Memory*, Science, vol. 245, pp. 843-845, Aug. 1989.

Shaw et al., *Negative Photoresists for Optical Lithography*, IBM J. Res. Develop., vol. 41, No. 1 / 2, pp. 81-94, Jan./Mar. 1997.

Shirai et al., *Photoacid and Photobase Generators : Chemistry and Applications to Polymeric Materials*, Prog. Polym. Sci., vol. 21, pp. 1-45, 1996.

Smith, *Modern Optic Engineering*, 1966, McGraw-Hill, pp. 104-105.

Strickler et al., *Three-Dimensional Optical Data Storage in Refractive Media by Two-Photon Point Excitation*, Optics Letters, vol. 16, No. 22, pp. 1780-1782, Nov. 1991.

Strickler et al., *3-D Optical Data Storage By Two-Photon Excitation*, Adv. Mater., vol. 5, No. 6, pp. 479, 1993.

Thayumanavan et al., *Synthesis of Unsymmetrical Triarylamines for Photonic Applications via One-Pot Palladium-Catalyzed Aminations*, Chem. Mater., vol. 9, pp. 3231-3235, 1997.

Wan et al., *Contrasting Photosolvolytic Reactivities of 9-Fluorenol vs. 5-Suberenol Derivatives. Enhanced Rate of Formation of Cyclically Conjugated Four π Carbocations in the Excited State*, J. Am. Chem. Soc., vol. 111, pp. 4887-4895, 1989.

Williams et al., *Two-Photon Molecular Excitation Provides Intrinsic 3-Dimensional Resolution for Laser-based Microscopy and Microphotochemistry*, FASEB Journal, vol. 8, pp. 804-813, Aug. 1994.

Xu et al., *Multiphoton Fluorescence Excitation: New Spectral Windows for Biological Nonlinear Microscopy*, Proc. Natl. Acad. Sci. USA, vol. 93, pp. 10763-10768, Oct. 1996.

Yuste et al., *Dendritic Spines as Basic Functional Units of Neuronal Integration*, Nature, vol. 375, pp. 682-684, Jun. 1995.

Kosar, *Photochemical Formation and Destruction of Dyes, Light-Sensitive Systems*, John Wiley & Sons, New York, NY, 1965, Chapter 8.

Badlwinson, *Auxiliaries Associated With Main Dye Classes, Colorants and Auxiliaries*, vol. 2, 1990, Chapter 12.

Syper et al., *Synthesis of Oxiranylquinones as New Potential Bioreductive Alkylating Agents*, Tetrahedron, vol. 39, No. 5, pp. 781-792, 1983.

Zollinger, *Color Chemistry*, VCH, Weinheim, GE, 1991, Chapter 8.

Misawa et al., *Multibeam Laser Manipulation and Fixation of Microparticles*, Appl. Phys. Letter, vol. 60, No. 3, pp. 310-312, Jan. 20, 1992. (XP 002189602).

Sun et al., *Photonic Crystal Structures With SubmicrometerSpatial Resolution Achieved By High Power Femtosecond Laser-Induced Photopolymerization*, SPIE, vol. 3888, pp. 122-130, 2000. (XP 001051864).

Belfield et al., *Near-IR two photon absorbing dyes and photoinitiated cationic polymerization*, Polymer Preprints, vol. 41(1) pp. 578-579 (Mar. 2000).

Belfield et al., *Multiphoton-absorbing organic material for microfabrication, emerging optical applications and non-destructive three dimensional imaging*, J.Phys. Org. Chem. vol. 13, pp. 837-849 (2000).

* cited by examiner

PROCESS FOR PRODUCING MICROFLUIDIC ARTICLES

STATEMENT OF PRIORITY

This application claims the priority of U.S. Provisional Application No. 60/211,707 filed Jun. 15, 2000, the contents of which are hereby incorporated by reference.

FIELD

This invention relates to microfluidic articles and to processes for their production.

BACKGROUND

In recent years, there has been a drive toward reducing the size of instrumentation used for analyzing and otherwise manipulating fluids (that is, liquid and gaseous materials). A reduced size offers several advantages, including the ability to analyze very small samples, increased analytical speed, the ability to use reduced amounts of reagents, and reduced overall cost.

Various articles or devices for microfluidic applications have been proposed. These devices typically include a glass or silicon substrate having a lithographically-patterned and etched surface that is provided with one or more structures to form a microfluid processing architecture. Polymeric or plastic substrates such as polyacrylates, polyesters, and polycarbonates have also been employed. In this case, the microfluid processing architecture is typically formed by microreplication of a structure on one surface of the plastic substrate.

For both the glass- and plastic-based devices, a structure forming the microfluid processing architecture is generally patterned onto a substantially planar surface of the substrate and must then be sealed with a cover plate, in order to complete the formation of the microfluid processing architecture and provide a device that typically has entrance and exit ports that provide fluid communication between the enclosed microfluidic architecture and the outside world. For glass or silicon substrates, the cover is typically made of glass and must be bonded to the lithographically-patterned surface at temperatures approaching 800° C. Often, the bonding is incomplete or the substrate cracks in the process. For plastic devices, the cover plate is typically another polymer film attached to the microreplicated surface of the device with adhesives or by solvent welding. Adhesives can introduce impurities and can affect the performance of the device, if they constitute one of the exposed surfaces of its enclosed microchannels. Solvent welding can introduce deformations in the microchannels of the fluid-handling architecture.

Thus, we recognize that there is a need for glass- and polymer-based microfluidic articles or devices that can be produced in such a way that the lamination of a cover plate can be avoided. We also recognize that there is a need for glass- and polymer-based microfluidic articles or devices having an increased density of microfluidic elements (for example, microchannels, mixing junctions, reaction microwells, separation channels, and detection zones) beyond what can be achieved with substantially planar microfluid processing architectures.

SUMMARY

Briefly, in one aspect, this invention provides a process for producing microfluidic articles using multiphoton (for example, two-photon) absorption. The process comprises (a) preparing a photoreactive composition comprising (1) at least one reactive species that is a polymer or a polymer precursor and that is capable of undergoing an acid- or radical-initiated chemical reaction and (2) at least one multiphoton photoinitiator system comprising photochemically effective amounts of (i) at least one multiphoton photosensitizer that is capable of simultaneously absorbing at least two photons, (ii) optionally, at least one electron donor compound different from the multiphoton photosensitizer and capable of donating an electron to an electronic excited state of the photosensitizer, and (iii) at least one electron acceptor compound that is capable of being photosensitized by accepting an electron from an electronic excited state of the photosensitizer, resulting in the formation of at least one free radical and/or acid; (b) exposing (preferably, by pulse irradiating) a portion of the composition to light sufficient to cause simultaneous absorption of at least two photons, thereby forming exposed and unexposed portions of the composition, and thereby inducing at least one acid- or radical-initiated chemical reaction in the exposed portion; and (c) removing either the exposed or the unexposed portion of the composition, so as to form a microfluidic article comprising a seamless polymer matrix that defines at least one inlet, at least one outlet, and a microfluid processing architecture (at least one fluid-processing structure, as explained below) that is capable of fluidic communication with the inlet and the outlet and that is otherwise fully enclosed within the polymer matrix.

Preferably, the reactive species is a polymer precursor; the multiphoton photosensitizer has a two-photon absorption cross-section greater than that of fluorescein; the electron acceptor compound is selected from the group consisting of iodonium salts, sulfonium salts, diazonium salts, azinium salts, chloromethylated triazines, and triarylimidazolyl dimers; and the electron donor compound (if used) has an oxidation potential that is greater than zero and less than or equal to that of p-dimethoxybenzene.

The above-described two- and three-component photoinitiator systems provide enhanced multiphoton photosensitivity and enable the rapid fabrication of three-dimensional structures. Thus, it has been discovered that the process of the invention can be used to produce seamless polymeric portions of microfluidic articles. Even more significantly, it has been discovered that the process can also be used to produce seamless polymeric microfluidic articles in their entirety, without the need for a cover plate and an additional bonding or lamination step. This means that the process can be used to avoid the problems associated with the use of cover plates (for example, contamination, cracking, deformation, and incomplete bonding, as described above). In addition, the process can be used to produce seamless polymeric microfluidic articles having a microfluid processing architecture that provides an increased density of microfluidic elements or fluid-processing structures (for example, microchannels, mixing junctions, reaction microwells, separation channels, and detection zones) beyond what can be achieved with substantially planar microfluid processing architectures.

In another aspect, this invention also provides a microfluidic article prepared by the process of the invention.

BRIEF DESCRIPTION OF THE DRAWINGS

These and other features, aspects, and advantages of the present invention will become better understood with regard to the following description, appended claims, and accompanying drawings, wherein:

Figure 1:
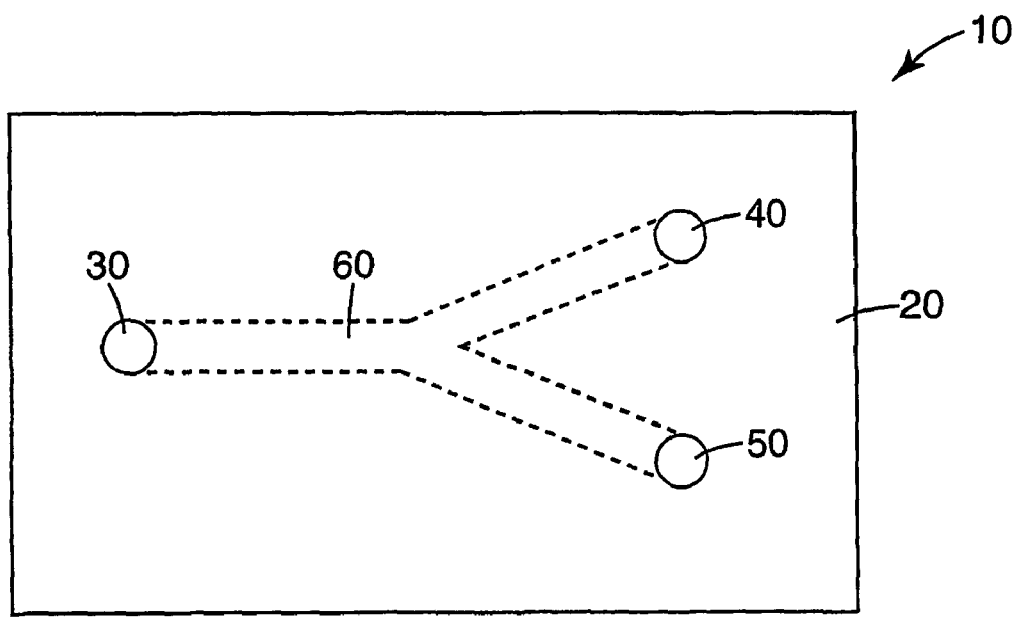
FIGS. 1 and 2 show a top plan view and a side elevation view, respectively, of an embodiment of a microfluidic article prepared by the process of the invention.

These figures, which are idealized, are not drawn to scale and are intended to be merely illustrative and nonlimiting.

DETAILED DESCRIPTION

Definitions

As used in this patent application:

"multiphoton absorption" means simultaneous absorption of two or more photons to reach a reactive, electronic excited state that is energetically inaccessible by the absorption of a single photon of the same energy;

"simultaneous" means two events that occur within the period of $10^{-14}$ seconds or less;

"electronic excited state" means an electronic state of a molecule that is higher in energy than the molecule's electronic ground state, that is accessible via absorption of electromagnetic radiation, and that has a lifetime greater than $10^{-13}$ seconds;

"cure" means to effect polymerization and/or to effect crosslinking;

"optical system" means a system for controlling light, the system including at least one element chosen from refractive optical elements such as lenses, reflective optical elements such as mirrors, and diffractive optical elements such as gratings. Optical elements shall also include diffusers, waveguides, and other elements known in the optical arts;

"three-dimensional light pattern" means an optical image wherein the light energy distribution resides in a volume or in multiple planes and not in a single plane;

"exposure system" means an optical system plus a light source;

"sufficient light" means light of sufficient intensity and appropriate wavelength to effect multiphoton absorption;

"photosensitizer" means a molecule that lowers the energy required to activate an electron acceptor compound by absorbing light of lower energy than is required by the electron acceptor compound for activation and interacting with the electron acceptor compound to produce a photoinitiating species therefrom;

"photochemically effective amounts" (of the components of the photoinitiator system) means amounts sufficient to enable the reactive species to undergo at least partial reaction under the selected exposure conditions (as evidenced, for example, by a change in density, viscosity, color, pH, refractive index, or other physical or chemical property);

"microfluid processing architecture" refers to one or more fluid-processing structures arranged in a pre-determined pattern within a single plane (a "planar architecture") or multiple planes (a "three-dimensional architecture"). Preferably, the architecture includes at least one structure having a cross-sectional dimension no greater than about 1000 micrometers. Useful fluid-processing structures include microchannels, fluid reservoirs, sample handling regions, and combinations thereof;

"fluid" means a liquid and/or a gas;

"fluidic communication" refers to acceptance and expulsion of fluids;

"polymer precursor" is a monomer and/or oligomer; and

"photoinhibitor" means a species that, upon irradiation, substantially prevents a photochemical reaction.

Other features and advantages of the invention will be apparent from the following description and from the claims.

Reactive Species

Reactive species suitable for use in the photoreactive composition include both curable and non-curable species. Curable species are generally preferred and include, for example, addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (which species are most commonly acid-initiated and which include, for example, epoxies, vinyl ethers, cyanate esters, etc.), and the like, and mixtures thereof.

Suitable ethylenically-unsaturated species are described, for example, by Palazzotto et al. in U.S. Pat. No. 5,545,676 at column 1, line 65, through column 2, line 26, and include mono-, di-, and poly-acrylates and methacrylates (for example, tetrahydrofurfuryl acrylate, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate,1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate, the bis-acrylates and bis-methacrylates of polyethylene glycols of molecular weight about 200–500, copolymerizable mixtures of acrylated monomers such as those of U.S. Pat. No. 4,652,274, and acrylated oligomers such as those of U.S. Pat. No. 4,642,126); unsaturated amides (for example, methylene bis-acrylamide, methylene bis-methacrylamide, 1,6-hexamethylene bis-acrylamide, diethylene triamine trisacrylamide and beta-methacrylaminoethyl methacrylate); vinyl compounds (for example, styrene, diallyl phthalate, divinyl succinate, divinyl adipate, and divinyl phthalate); and the like; and mixtures thereof. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as Sarbox™ resins available from Sartomer (for example, Sarbox™ 400, 401, 402, 404, and 405). Other useful reactive polymers curable by free radical chemistry include those polymers that have a hydrocarbyl backbone and pendant peptide groups with free-radically polymerizable functionality attached thereto, such as those described in U.S. Pat. No. 5,235,015 (Ali et al.). Mixtures of two or more monomers, oligomers, and/or reactive polymers can be used if desired. Preferred ethylenically-unsaturated species include (meth)acrylates, aromatic acid (meth)acrylate half ester resins, and polymers that have a hydrocarbyl backbone and pendant peptide groups with free-radically polymerizable functionality attached thereto.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl)adipate. A more detailed list of useful epoxides of this nature is set forth in U.S. Pat. No. 3,117,099.

Other epoxy-containing materials that are useful include glycidyl ether monomers of the formula

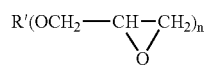

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in Handbook of Epoxy Resins, Lee and Neville, McGraw-Hill Book Co., New York (1967).

Numerous commercially available epoxy resins can also be utilized. In particular, epoxies that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations Epon™ 828, Epon™ 825, Epon™ 1004, and Epon™ 1010 from Resolution Performance Products, formerly Shell Chemical Co., as well as DER™-331, DER™-332, and DER™-334 from Dow Chemical Co.), vinylcyclohexene dioxide (for example, ERL-4206 from Union Carbide Corp.), 3,4-epoxycyclohexylmethyl-3,4-epoxycyclohexene carboxylate (for example, ERL-4221 or Cyracure™ UVR 6110 or UVR 6105 from Union Carbide Corp.), 3,4-epoxy-6-methylcyclohexylmethyl-3,4-epoxy-6-methyl-cyclohexene carboxylate (for example, ERL-4201 from Union Carbide Corp.), bis(3,4-epoxy-6-methylcyclohexylmethyl)adipate (for example, ERL-4289 from Union Carbide Corp.), bis(2,3-epoxycyclopentyl)ether (for example, ERL-0400 from Union Carbide Corp.), aliphatic epoxy modified from polypropylene glycol (for example, ERL4050 and ERL-4052 from Union Carbide Corp.), dipentene dioxide (for example, ERL-4269 from Union Carbide Corp.), epoxidized polybutadiene (for example, Oxiron™ 2001 from FMC Corp.), silicone resin containing epoxy functionality, flame retardant epoxy resins (for example, DER™-580, a brominated bisphenol type epoxy resin available from Dow Chemical Co.), 1,4-butanediol diglycidyl ether of phenolformaldehyde novolak (for example, DEN™-431 and DEN™-438 from Dow Chemical Co.), resorcinol diglycidyl ether (for example, Kopoxite™ from Koppers Company, Inc.), bis(3,4-epoxycyclohexyl) adipate (for example, ERL-4299 or UVR-6128, from Union Carbide Corp.), 2'-(3,4-epoxycyclohexyl-5,5-spiro-3,4-epoxy)cyclohexane-meta-dioxane (for example, ERL-4234 from Union Carbide Corp.), vinylcyclohexene monoxide 1,2-epoxyhexadecane (for example, UVR-6216 from Union Carbide Corp.), alkyl glycidyl ethers such as alkyl $C_8$–$C_{10}$ glycidyl ether (for example, Heloxy™ Modifier 7 from Resolution Performance Products), alkyl $C_{12}$–$C_{14}$ glycidyl ether (for example, Heloxy™ Modifier 8 from Resolution Performance Products), butyl glycidyl ether (for example, Heloxy™ Modifier 61 from Resolution Performance Products), cresyl glycidyl ether (for example, Heloxy™ Modifier 62 from Resolution Performance Products), p-tert-butylphenyl glycidyl ether (for example, Heloxy™ Modifier 65 from Resolution Performance Products), polyfunctional glycidyl ethers such as diglycidyl ether of 1,4-butanediol (for example, Heloxy™ Modifier 67 from Resolution Performance Products), diglycidyl ether of neopentyl glycol (for example, Heloxy™ Modifier 68 from Resolution Performance Products), diglycidyl ether of cyclohexanedimethanol (for example, Heloxy™ Modifier 107 from Resolution Performance Products), trimethylol ethane triglycidyl ether (for example, Heloxy™ Modifier 44 from Resolution Performance Products), trimethylol propane triglycidyl ether (for example, Heloxy™ Modifier 48 from Resolution Performance Products), polyglycidyl ether of an aliphatic polyol (for example, Heloxy™ Modifier 84 from Resolution Performance Products), polyglycol diepoxide (for example, Heloxy™ Modifier 32 from Resolution Performance Products), bisphenol F epoxides (for example, Epon™-1138 or GY-281 from Ciba-Geigy Corp.), and 9,9-bis[4-(2,3-epoxypropoxy)-phenyl]fluorenone (for example, Epon™ 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well, known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717 (Eckberg), which are commercially available from the General Electric Company. These are polydimethylsiloxanes in which 1–20 mole % of the silicon atoms have been substituted with epoxyalkyl groups (preferably, epoxy cyclohexylethyl, as described in U.S. Pat. No. 5,753,346 (Kessel)).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic), or functionalities (such as polar and non-polar). Other cationically-reactive polymers (such as vinyl ethers and the like) can additionally be incorporated, if desired.

Preferred epoxies include aromatic glycidyl epoxies (such as the Epon™ resins available from Resolution Performance Products) and cycloaliphatic epoxies (such as ERL-4221 and ERL-4299 available from Union Carbide).

Suitable cationally-reactive species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (Rapi-Cure™ DVE-3, available from International Specialty Products, Wayne, N.J.), trimethylolpropane trivinyl ether (TMPTVE, available from BASF Corp., Mount Olive, N.J.), and the Vectomer™ divinyl ether resins from Allied Signal (for example, Vectomer™ 2010, Vectomer™ 2020, Vectomer™ 4010, and Vectomer™ 4020 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373 (Kaisaki et al.)) can also be utilized in combination with epoxy- and/or vinyl ether-functional materials.

Non-curable species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs when hydrogen ions initiate reactions that generate more hydrogen ions or other acidic species, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in Proc. SPIE 2438, 474 (1995), and the like); depolymerization (for example, polyphthalaldehyde-based materials); and rearrangement (for example, materials based on the pinacol rearrangements).

If desired, mixtures of different types of reactive species can be utilized in the photoreactive composition. For example, mixtures of free-radically-reactive species and cationically-reactive species, mixtures of curable species and non-curable species, and so forth, are also useful. The photoreactive composition preferably comprises reactive species that have relatively low viscosities, and thus polymer precursors (that is, monomers and/or oligomers) are generally preferred reactive species. Preferably, the photoreactive composition comprises at least one multifunctional reactive species (more preferably, at least one multifunctional curable species).

Photoinitiator System

Multiphoton photoinitiator systems suitable for use in the photoreactive composition comprise photochemically effective amounts of (1) at least one multiphoton photosensitizer that is capable of simultaneously absorbing at least two photons (preferably, a multiphoton photosensitizer that has a two-photon absorption cross-section greater than that of fluorescein (generally, greater than about $50 \times 10^{-50}$ $cm^4$ sec/photon, as measured by the method described by C. Xu and W. W. Webb in J. Opt. Soc. Am. B, 13, 481 (1996))); (2) optionally, at least one electron donor compound different from the multiphoton photosensitizer and capable of donating an electron to an electronic excited state of the photosensitizer (preferably, an electron donor compound having an oxidation potential that is greater than zero and less than or equal to that of p-dimethoxybenzene); and (3) at least one electron acceptor compound that is capable of being photosensitized by accepting an electron from an electronic excited state of the photosensitizer, resulting in the formation of at least one free radical and/or acid (preferably, an electron acceptor compound selected from the group consisting of iodonium salts, sulfonium salts, diazonium salts, azinium salts, chloromethylated triazines, and triarylimidazolyl dimers).

(1) Multiphoton Photosensitizers

Multiphoton photosensitizers suitable for use in the multiphoton photoinitiator system of the photoreactive composition are those that are capable of simultaneously absorbing at least two photons when exposed to sufficient light. Essentially any photosensitizing dye that has a multiphoton, electron absorption band in an accessible wavelength region can be utilized.

Preferred photosensitizers have a two-photon absorption cross-section greater than that of fluorescein (that is, greater than that of 3',6'-dihydroxyspiro[isobenzofuran-1(3H), 9'-[9H]xanthen]3-one). Generally, the preferred cross-section can be greater than about $50 \times 10^{-50}$ $cm^4$ sec/photon, as measured by the method described by C. Xu and W. W. Webb in J. Opt. Soc. Am. B, 13 481 (1996) (which is referenced by Marder and Perry et al. in International Publication No. WO 98/21521 at page 85, lines 18–22).

This method involves the comparison (under identical excitation intensity and photosensitizer concentration conditions) of the two-photon fluorescence intensity of the photosensitizer with that of a reference compound. The reference compound can be selected to match as closely as possible the spectral range covered by the photosensitizer absorption and fluorescence. In one possible experimental set-up, an excitation beam can be split into two arms, with 50% of the excitation intensity going to the photosensitizer and 50% to the reference compound. The relative fluorescence intensity of the photosensitizer with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well-known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by I. B. Berlman in *Handbook of Fluorescence Spectra of Aromatic Molecules*, Second Edition, pages 24–27, Academic Press, New York (1971); by J. N. Demas and G. A. Crosby in J. Phys.

Chem. 75, 991–1024 (1971); and by J. V. Morris, M. A. Mahoney, and J. R. Huber in J. Phys. Chem. 80, 969–974 (1976).

Assuming that the emitting state is the same under one- and two-photon excitation (a common assumption), the two-photon absorption cross-section of the photosensitizer, ($\delta_{sam}$), is equal to $\delta_{ref} K (I_{sam}/I_{ref})(\Phi_{sam}/\Phi_{ref})$, wherein $\delta_{ref}$ is the two-photon absorption cross-section of the reference compound, $I_{sam}$ is the fluorescence intensity of the photosensitizer, $I_{ref}$ is the fluorescence intensity of the reference compound, $\Phi_{sam}$ is the fluorescence quantum efficiency of the photosensitizer, $\Phi_{ref}$ is the fluorescence quantum efficiency of the reference compound, and K is a correction factor to account for slight differences in the optical path and response of the two detectors. K can be determined by measuring the response with the same photosensitizer in both the sample and reference arms. To ensure a valid measurement, the clear quadratic dependence of the two-photon fluorescence intensity on excitation power can be confirmed, and relatively low concentrations of both the photosensitizer and the reference compound can be utilized (to avoid fluorescence reabsorption and photosensitizer aggregration effects).

When the photosensitizer is not fluorescent, the yield of electronic excited states can to be measured and compared with a known standard. In addition to the above-described method of determining fluorescence yield, various methods of measuring excited state yield are known (including, for example, transient absorbance, phosphorescence yield, photoproduct formation or disappearance of photosensitizer (from photoreaction), and the like).

More preferably, the two-photon absorption cross-section of the photosensitizer is greater than about 1.5 times that of fluorescein (or, alternatively, greater than about $75 \times 10^{-50}$ cm$^4$ sec/photon, as measured by the above method); even more preferably, greater than about twice that of fluorescein (or, alternatively, greater than about $100 \times 10^{-50}$ cm$^4$ sec/photon); most preferably, greater than about three times that of fluorescein (or, alternatively, greater than about $150 \times 10^{-50}$ cm$^4$ sec/photon); and optimally, greater than about four times that of fluorescein (or, alternatively, greater than about $200 \times 10^{-50}$ cm$^4$ sec/photon).

Preferably, the photosensitizer is soluble in the reactive species (if the reactive species is liquid) or is compatible with the reactive species and with any binders (as described below) that are included in the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer (single photon absorption conditions), using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000–55,000 molecular weight, 9.0–13.0% hydroxyl content polyvinyl butyral (Butvar™ B76, Monsanto); 0.3 parts trimethylolpropane trimethacrylate; and 0.03 parts 2-methyl-4,6-bis(trichloromethyl)-s-triazine (see Bull. Chem. Soc. Japan, 42, 2924–2930 (1969)). To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH™ 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a photosensitizer can also be selected based in part upon shelf stability considerations. Accordingly, selection of a particular photosensitizer can depend to some extent upon the particular reactive species utilized (as well as upon the choices of electron donor compound and/or electron acceptor compound).

Particularly preferred multiphoton photosensitizers include those exhibiting large multiphoton absorption cross-sections, such as Rhodamine B (that is, N-[9-(2-carboxyphenyl)-6-(diethylamino)-3H-xanthen-3-ylidene]-N-ethylethanaminium chloride or hexafluoroantimonate) and the four classes of photosensitizers described, for example, by Marder and Perry et al. in International Patent Publication Nos. WO 98/21521 and WO 99/53242. The four classes can be described as follows: (a) molecules in which two donors are connected to a conjugated π (pi)-electron bridge; (b) molecules in which two donors are connected to a conjugated π (pi)-electron bridge which is substituted with one or more electron accepting groups; (c) molecules in which two acceptors are connected to a conjugated π (pi)-electron bridge; and (d) molecules in which two acceptors are connected to a conjugated π (pi)-electron bridge which is substituted with one or more electron donating groups (where "bridge" means a molecular fragment that connects two or more chemical groups, "donor" means an atom or group of atoms with a low ionization potential that can be bonded to a conjugated π (pi)-electron bridge, and "acceptor" means an atom or group of atoms with a high electron affinity that can be bonded to a conjugated π (pi)-electron bridge).

Representative examples of such preferred photosensitizers include the following:

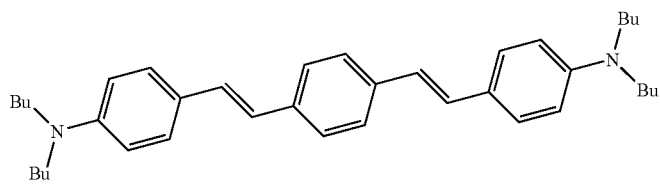

-continued
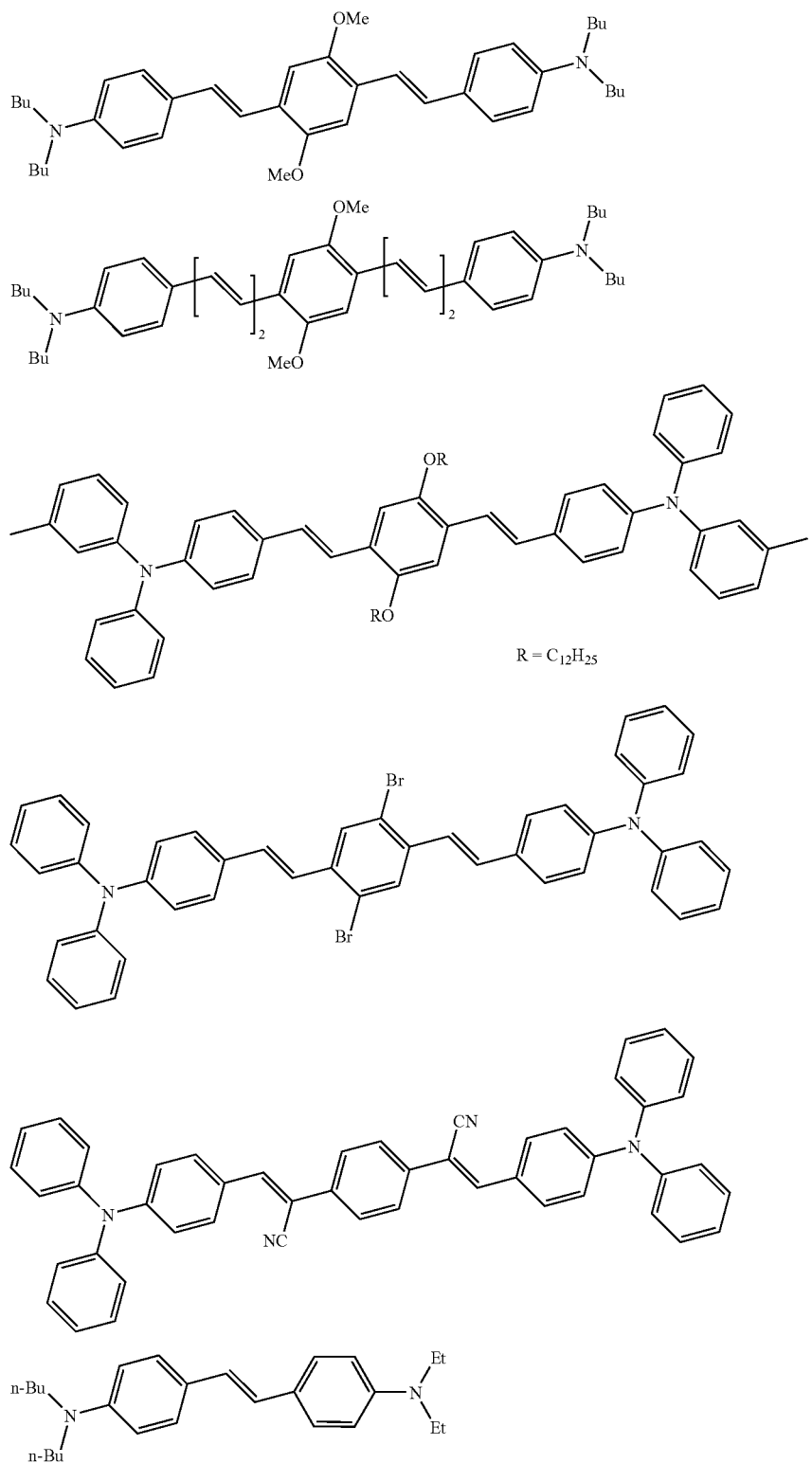

-continued
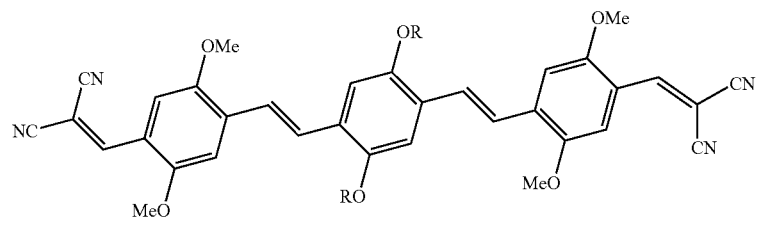
R = C₁₂H₂₅
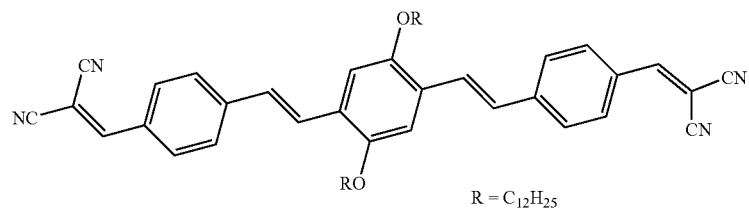
R = C₁₂H₂₅
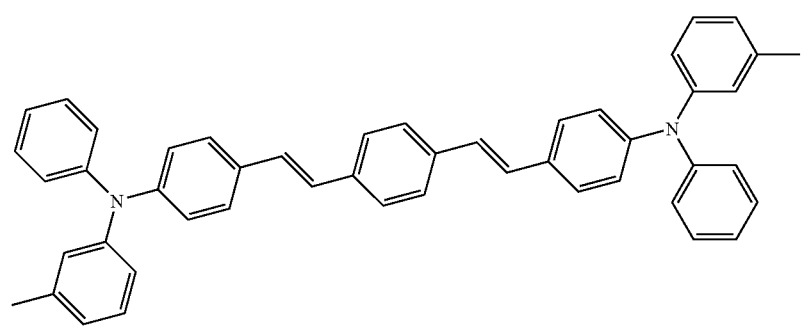
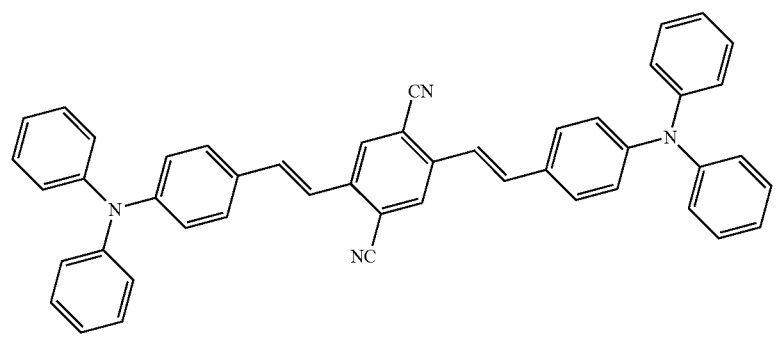
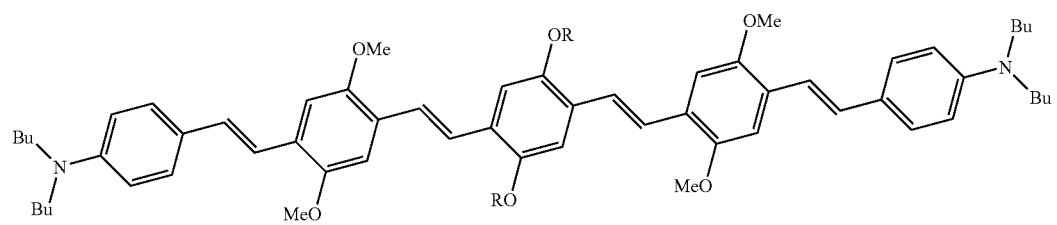
R = C₁₂H₂₅
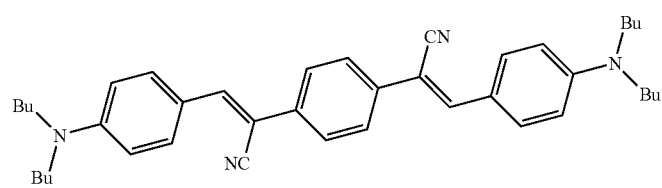

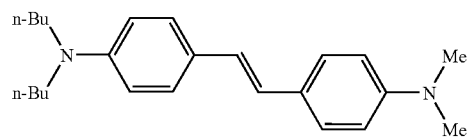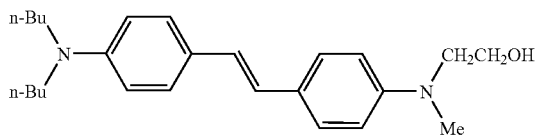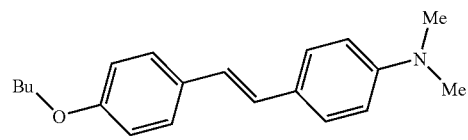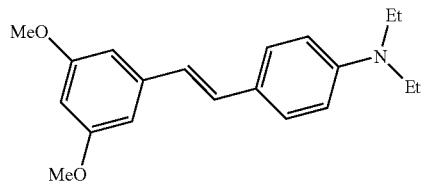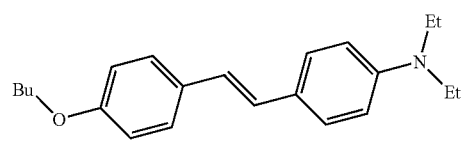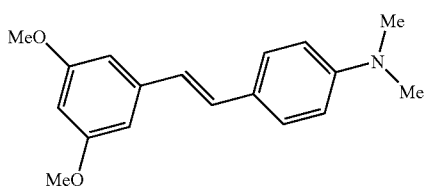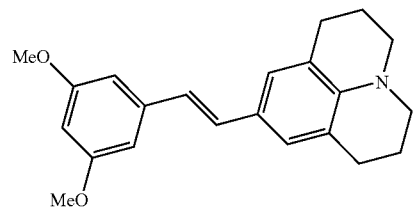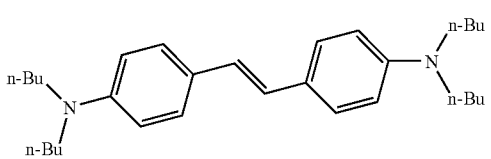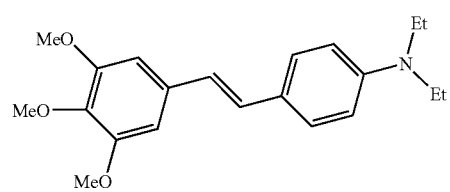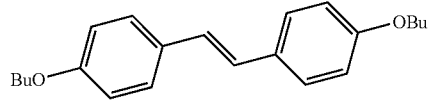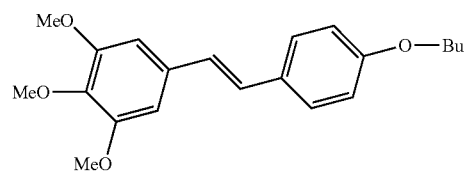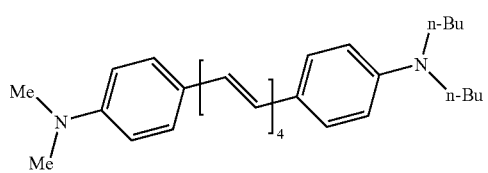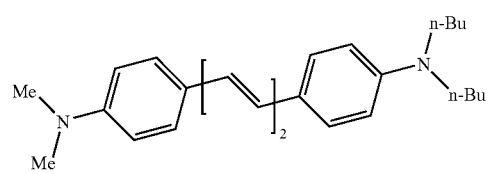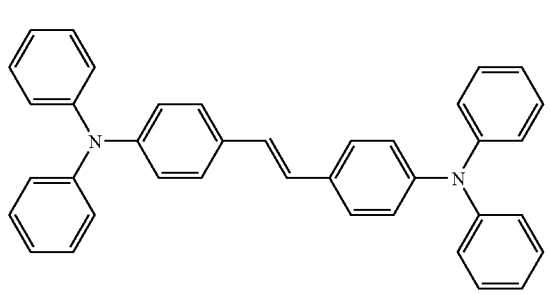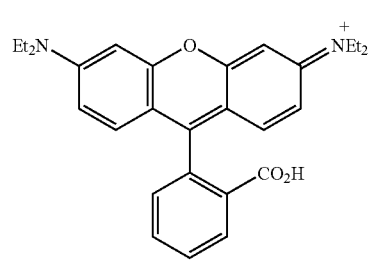
where X⁻ = Cl⁻, PF₆⁻, SbF₆⁻, AsF₆⁻, BF₄⁻, CF₃SO₃⁻

-continued

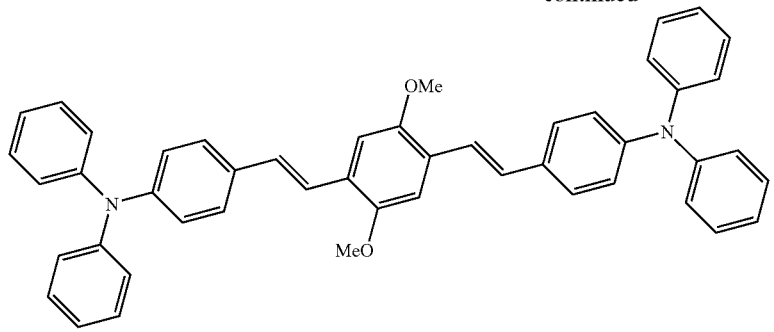

The four above-described classes of photosensitizers can be prepared by reacting aldehydes with ylides under standard Wittig conditions or by using the McMurray reaction, as detailed in International Patent Publication No. WO 98/21521.

Other compounds are described by Reinhardt et al. (for example, in U.S. Pat. Nos. 6,100,405, 5,859,251, and 5,770, 737) as having large multiphoton absorption cross-sections, although these cross-sections were determined by a method other than that described above. Representative examples of such compounds include:

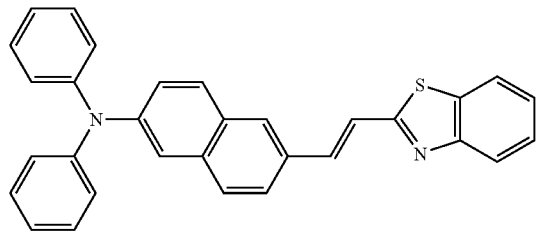

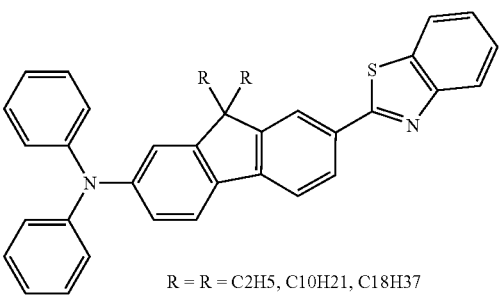

R = R = C2H5, C10H21, C18H37

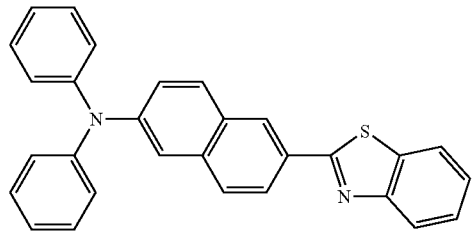

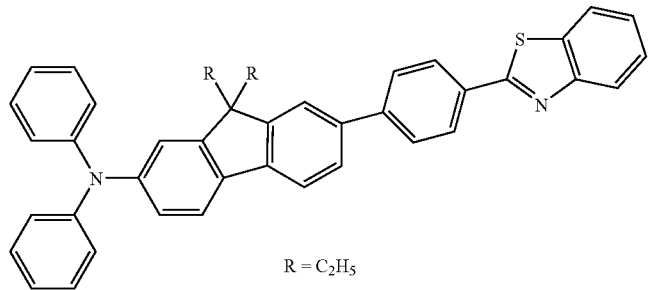

R = C$_2$H$_5$

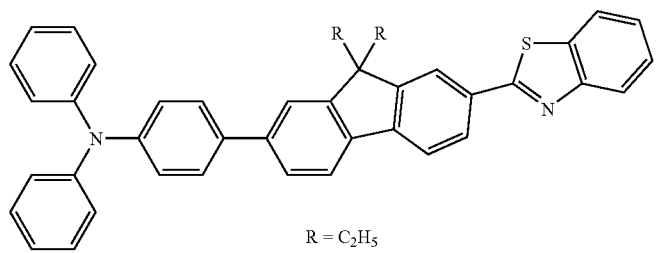

R = C$_2$H$_5$

-continued

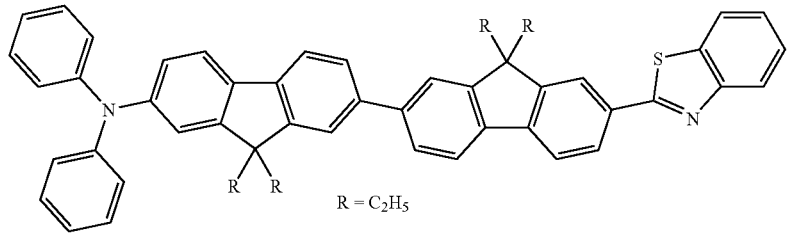

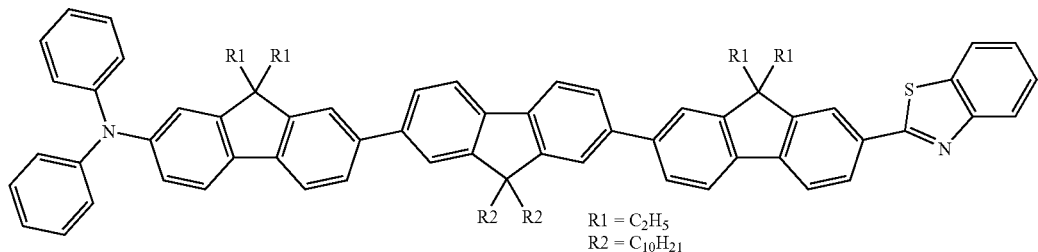

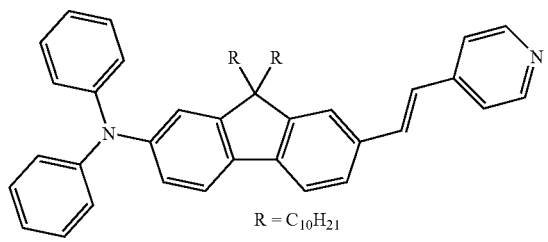
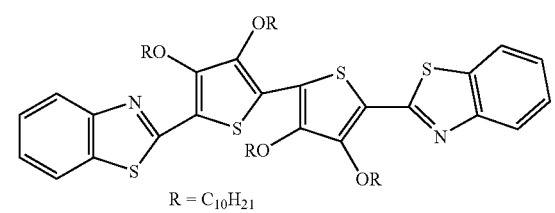

Other compounds which may be useful as photosensitizers in the present invention include but are not limited to fluorescein, p-bis(o-methylstyryl)benzene, eosin, rose Bengal, erythrosin, Coumarin 307 (Eastman Kodak), Cascade Blue hydrazide trisodium salt, Lucifer Yellow CH ammonium salt, 4,4-difluoro-1,3,5,7,8-pentamethyl-4-bora-3α,4α-diazaindacene-2,6-disulfonic acid disodium salt, 1,1-dioctadecyl-3,3,3',3'-tetramethylindocarbocyanine perchlorate, Indo-1 pentapotassium salt (Molecular Probes), 5-dimethylaminonaphthalene-1-sulfonyl hydrazine, 4',6-diamidino-2-phenylindole dihydrochloride, 5,7-diiodo-3-butoxy-6-fluorone, 9-fluorenone-2-carboxylic acid, and compounds having the following structures:

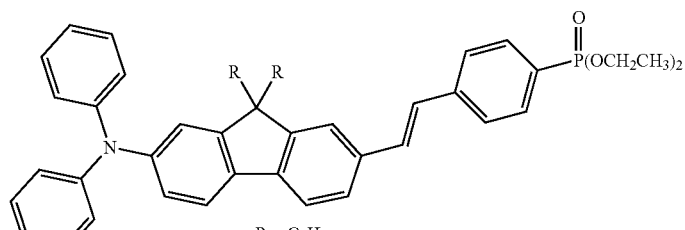

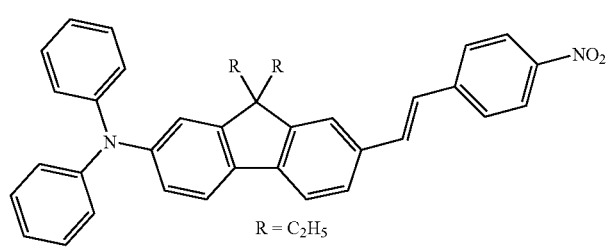

-continued

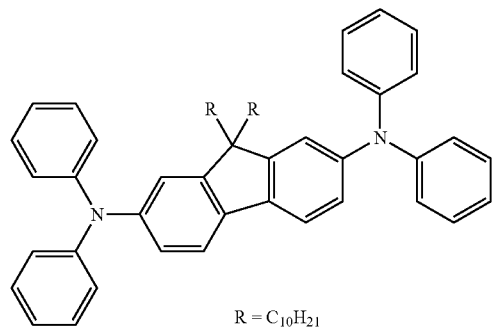
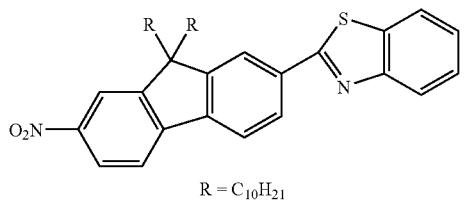

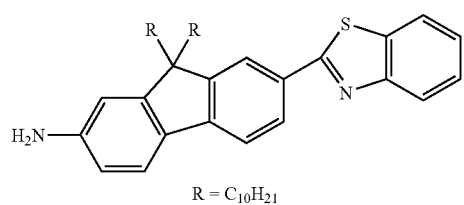
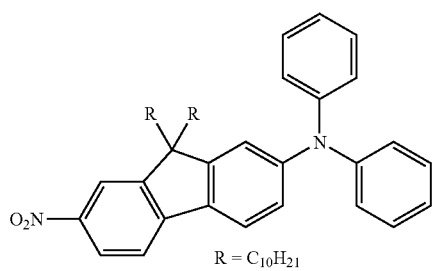

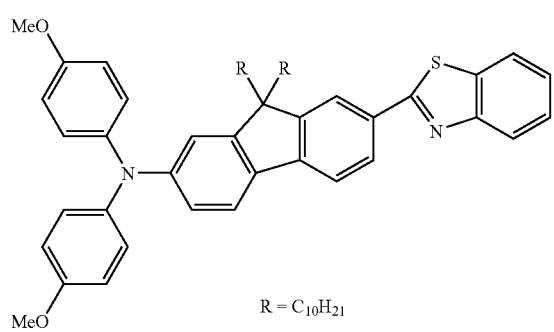

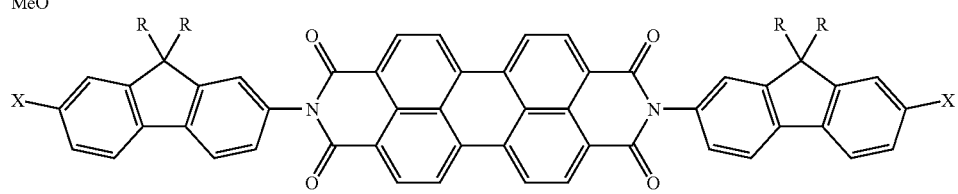

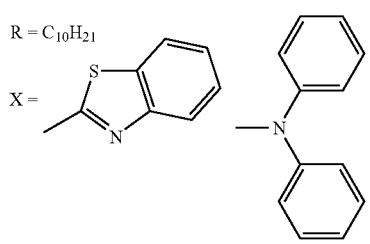

(2) Electron Donor Compounds

Electron donor compounds that can optionally be used in the multiphoton photoinitiator system of the photoreactive composition are those compounds (other than the photosensitizer itself) that are capable of donating an electron to an electronic excited state of the photosensitizer. Such compounds may be used, optionally, to increase the multiphoton photosensitivity of the photoinitiator system, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406 (Oxman et al.) at column 7, line 62, through column 8, line 49.)

In general, electron donor compounds suitable for use with particular photosensitizers and electron acceptor compounds can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Nonaqueous Systems* (1970). The potentials reflect relative energy relationships and can be used in the following manner to guide electron donor compound selection:

When the photosensitizer is in an electronic excited state, an electron in the highest occupied molecular orbital (HOMO) of the photosensitizer has been lifted to a higher energy level (namely, the lowest unoccupied molecular orbital (LUMO) of the photosensitizer), and a vacancy is left behind in the molecular orbital it initially occupied. The electron acceptor compound can accept the electron from the higher energy orbital, and the electron donor compound can donate an electron to fill the vacancy in the originally occupied orbital, provided that certain relative energy relationships are satisfied.

If the reduction potential of the electron acceptor compound is less negative (or more positive) than that of the photosensitizer, an electron in the higher energy orbital of the photosensitizer is readily transferred from the photosensitizer to the lowest unoccupied molecular orbital (LUMO) of the electron acceptor compound, since this represents an exothermic process. Even if the process is instead slightly endothermic (that is, even if the reduction potential of the photosensitizer is up to 0.1 volt more negative than that of the electron acceptor compound) ambient thermal activation can readily overcome such a small barrier.

In an analogous manner, if the oxidation potential of the electron donor compound is less positive (or more negative) than that of the photosensitizer, an electron moving from the HOMO of the electron donor compound to the orbital vacancy in the photosensitizer is moving from a higher to a lower potential, which again represents an exothermic process. Even if the process is slightly endothermic (that is, even if the oxidation potential of the photosensitizer is up to 0.1 volt more positive than that of the electron donor compound), ambient thermal activation can readily overcome such a small barrier.

Slightly endothermic reactions in which the reduction potential of the photosensitizer is up to 0.1 volt more negative than that of the electron acceptor compound, or the oxidation potential of the photosensitizer is up to 0.1 volt more positive than that of the electron donor compound, occur in every instance, regardless of whether the electron acceptor compound or the electron donor compound first reacts with the photosensitizer in its excited state. When the electron acceptor compound or the electron donor compound is reacting with the photosensitizer in its excited state, it is preferred that the reaction be exothermic or only slightly endothermic. When the electron acceptor compound or the electron donor compound is reacting with the photosensitizer ion radical, exothermic reactions are still preferred, but still more endothermic reactions can be expected in many instances to occur. Thus, the reduction potential of the photosensitizer can be up to 0.2 volt (or more) more negative than that of a second-to-react electron acceptor compound, or the oxidation potential of the photosensitizer can be up to 0.2 volt (or more) more positive than that of a second-to-react electron donor compound.

Suitable electron donor compounds include, for example, those described by D. F. Eaton in *Advances in Photochemistry*, edited by B. Voman et al., Volume 13, pp. 427–488, John Wiley and Sons, New York (1986); by Oxman et al. in U.S. Pat. No. 6,025,406 at column 7, lines 42–61; and by Palazzotto et al. in U.S. Pat. No. 5, 545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$borates (n+m=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as $n-C_3H_7Sn(CH_3)_3$, $(allyl)Sn(CH_3)_3$, and $(benzyl)Sn(n-C_3H_7)_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethylaminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis (dimethylamino)diphenylsilane, tris(dimethylamino) methylsilane, N,N-diethylaminotrimethylsilane, tris (dimethylamino)phenylsilane, tris(methylsilyl)amine, tris (dimethylsilyl)amine, bis(dimethylsilyl)amine, N,N-bis (dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetarnide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include
$Ar_3B^-(n-C_4H_9)N^+(C_2H_5)_4$
$Ar_3B^-(n-C_4H_9)N^+(CH_3)_4$
$Ar_3B^-(n-C_4H_9)N^+(n-C_4H_9)_4$
$Ar_3B^-(n-C_4H_9)Li^+$
$Ar_3B^-(n-C_4H_9)N^+(C_6H_{13})_4$
$Ar_3B^--(C_4H_9)N^+(CH_3)_3(CH_2)_2CO_2(CH_2)_2CH_3$
$Ar_3B^--(C_4H_9)N^+(CH_3)_3(CH_2)_2OCO(CH_2)_2CH_3$
$Ar_3B^--(sec-C_4H_9)N^+(CH_3)_3(CH_2)_2CO_2(CH_2)_2CH_3$
$Ar_3B^--(sec-C_4H_9)N^+(C_6H_{13})_4$
$Ar_3B^--(C_4H_9)N^+(C_8H_{17})_4$
$Ar_3B^--(C_4H_9)N^+(CH_3)_4$
$(p-CH_3O-C_6H_4)_3B^-(n-C_4H_9)N^+(n-C_4H_9)_4$
$Ar_3B^--(C_4H_9)N^+(CH_3)_3(CH_2)_2OH$
$ArB^-(n-C_4H_9)_3N^+(CH_3)_4$
$ArB^-(C_2H_5)_3N^+(CH_3)_4$
$Ar_2B^-(n-C_4H_9)_2N^+(CH_3)_4$
$Ar_3B^-(C_4H_9)N^+(C_4H_9)_4$
$Ar_4B^-N^+(C_4H_9)_4$
$ArB^-(CH_3)_3N^+(CH_3)_4$
$(n-C_4H_9)_4B^-N^+(CH_3)_4$
$Ar_3B^-(C_4H_9)P^+(C_4H_9)_4$ (where Ar is phenyl, naphthyl, substituted (preferably, fluoro-substituted) phenyl, substituted naphthyl, and like groups having greater numbers of fused aromatic rings), as well as tetramethylammonium n-butyltriphenylborate and tetrabutylammonium n-hexyl-tris(3-fluorophenyl)borate (available as CGI 437 and CGI 746 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

(3) Electron Acceptor Compounds

Electron acceptor compounds that can be used for photoinitiation of the reactive species of the photoreactive composition are those that are capable of being photosensitized by accepting an electron from an electronic excited state of the multiphoton photosensitizer, resulting in the formation of at least one free radical and/or acid. Such electron acceptor compounds include iodonium salts (for example, diaryliodonium salts), chloromethylated triazines (for example, 2-methyl-4,6-bis(trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

The electron acceptor compound is preferably soluble in the reactive species and is preferably shelf-stable (that is, does not spontaneously promote reaction of the reactive species when dissolved therein in the presence of the photosensitizer and the electron donor compound). Accordingly, selection of a particular electron acceptor compound can depend to some extent upon the particular reactive species, photosensitizer, and electron donor compound chosen, as described above. If the reactive species is capable of undergoing an acid-initiated chemical reaction, then the photoinitiator is an onium salt (for example, an iodonium, sulfonium, or diazonium salt).

Suitable iodonium salts include those described by Palazzotto et al. in U.S. Pat. No. 5,545,676 at column 2, lines 28 through 46. Suitable iodonium salts are also described in U.S. Pat. Nos. 3,729,313, 3,741,769, 3,808,006, 4,250,053 and 4,394,403. The iodonium salt can be a simple salt (for example, containing an anion such as $Cl^-$, $Br^-$, $I^-$ or $C_4H_5SO_3^-$) or a metal complex salt (for example, containing $SbF_6^-$, $PF_6^-$, $BF_4^-$, tetrakis(perfluorophenyl)borate, $SbF_5OH^-$ or $AsF_6^-$). Mixtures of iodonium salts can be used if desired.

Examples of useful aromatic iodonium complex salt electron acceptor compounds include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl)iodonium hexafluorophosphate; di(4-bromophenyl)iodonium hexafluorophosphate; di(4-methoxyphenyl)iodonium hexafluorophosphate; di(3-carboxyphenyl)iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, SarCat™ SR 1012 available from Sartomer Company), and mixtures thereof.

Useful chloromethylated triazines include those described in U.S. Pat. No. 3,779,778 (Smith et al.) at column 8, lines 45–50, which include 2,4-bis(trichloromethyl)-6-methyl-s-triazine, 2,4,6-tris(trichloromethyl)-s-triazine, and the more preferred chromophore-substituted vinylhalomethyl-s-triazines disclosed in U.S. Pat. Nos. 3,987,037 and 3,954,475 (Bonham et al.).

Useful diazonium salts include those described in U.S. Pat. No. 4,394,433 (Gatzke), which comprise a light sensitive aromatic moiety (for example, pyrrolidine, morpholine, aniline, and diphenyl amine) with an external diazonium group (—N$^+$=N) and an anion (for example, chloride, tri-isopropyl naphthalene sulfonate, tetrafluoroborate, and the bis(perfluoroalkylsulfonyl)methides) associated therewith. Examples of useful diazonium cations include 1-diazo-4-anilinobenzene, N-(4-diazo-2,4-dimethoxy phenyl)pyrrolidine, 1-diazo-2,4-diethoxy-4-morpholino benzene, 1-diazo-4-benzoyl amino-2,5-diethoxy benzene, 4-diazo-2,5-dibutoxy phenyl morpholino, 4-diazo-1-dimethyl aniline, 1-diazo-N,N-dimethylaniline, 1-diazo-4-N-methyl-N-hydroxyethyl aniline, and the like.

Useful sulfonium salts include those described in U.S. Pat. No. 4,250,053 (Smith) at column 1, line 66, through column 4, line 2, which can be represented by the formulas:

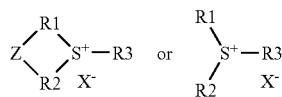

wherein $R_1$, $R_2$, and $R_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, and so forth) and alkyl groups having from 1 to about 20 carbon atoms. As used here, the term "alkyl" includes substituted alkyl (for example, substituted with such groups as halogen, hydroxy, alkoxy, or aryl). At least one of $R_1$, $R_2$, and $R_3$ is aromatic, and, preferably, each is independently aromatic. Z is selected from the group consisting of a covalent bond, oxygen, sulfur, —S(=O)—, —C(=O)—, —(O=)S(=O)—, and —N(R)—, where R is aryl (of about 6 to about 20 carbons, such as phenyl), acyl (of about 2 to about 20 carbons, such as acetyl, benzoyl, and so forth), a carbon-to-carbon bond, or —($R_4$—)C(—$R_5$)—, where $R_4$ and $R_5$ are independently selected from the group consisting of hydrogen, alkyl groups having from 1 to about 4 carbon atoms, and alkenyl groups having from about 2 to about 4 carbon atoms. X$^-$ is an anion, as described below.

Suitable anions, X$^-$, for the sulfonium salts (and for any of the other types of electron acceptor compounds) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C^-(SO_2CF_3)_2$, $(3,5$-bis$(CF_3)C_6H_3)SO_2N^-SO_2CF_3$, $C_6H_5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5$-bis$(CF_3)C_6H_3)_4B^-$, $(C_6F_5)_4B^-$, (p-$CF_3C_6H_4)_4B^-$, (m-$CF_3C_6H_4)_4B^-$, (p-$FC_6H_4)_4B^-$, $(C_6F_5)_3(CH_3)B^-$, $(C_6F_5)_3$(n-$C_4H_9)B^-$, (p-$CH_3C_6H_4)_3(C_6F_5)B^-$, $(C_6F_5)_3FB^-$, $(C_6H_5)_3(C_6F_5)B^-$, $(CH_3)_2$(p-$CF_3C_6H_4)_2B^-$, $(C_6F_5)_3$(n-$C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5$-bis$(CF_3)C_6H_3)_4B^-$, $(C_6F_5)_4B^-$, $(C_6F_5)_3$(n-$C_4H_9)B^-$, $(C_6F_5)_3FB^-$, and $(C_6F_5)_3(CH_3)B^-$.

Suitable anions containing other metal or metalloid centers include, for example, $(3,5$-bis$(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. The foregoing lists are not intended to be exhaustive, as other useful boron-centered nonnucleophilic salts, as well as other useful anions containing other metals or metalloids, will be readily apparent (from the foregoing general formulas) to those skilled in the art.

Preferably, the anion, X$^-$, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt electron acceptor compounds include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluorophosphate
tri(4-phenoxyphenyl)sulfonium hexafluorophosphate
di(4-ethoxyphenyl)methylsulfonium hexafluoroarsenate
4-acetonylphenyldiphenylsulfonium tetrafluoroborate
4-thiomethoxyphenyldiphenylsulfonium hexafluorophosphate
di(methoxysulfonylphenyl)methylsulfonium hexafluoroantimonate
di(nitrophenyl)phenylsulfonium hexafluoroantimonate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyldiphenylsulfonium tetrafluoroborate
p-(phenylthiophenyl)diphenylsulfonium hexafluoroantimonate
10-methylphenoxathiinium hexafluorophosphate
5-methylthianthrenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Preferred sulfonium salts include triaryl-substituted salts such as triarylsulfonium hexafluoroantimonate (for example, SarCat™ SR1010 available from Sartomer Company), triarylsulfonium hexafluorophosphate (for example, SarCat™ SR 1011 available from Sartomer Company), and triarylsulfonium hexafluorophosphate (for example, SarCat™ KI85 available from Sartomer Company).

Useful azinium salts include those described in U.S. Pat. No. 4,859,572 (Farid et al.) at column 8, line 51, through column 9, line 46, which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the photosensitizer to the azinium electron acceptor compound. In one preferred form, the quaternizing substituent is an oxy substituent. The oxy substituent, —O-T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)-$T^1$ radical, where $T^1$ can be any of the various alkyl and aralkyl radicals described above. In addition, $T^1$ can be an aryl radical, such as phenyl or naphthyl. The aryl radical can in turn be substituted. For example, $T^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized when the oxy substituent, —O-T, contains 1 or 2 carbon atoms. The azinium nuclei need include no substituent other than the quaternizing substituent. However, the presence of other substituents is not detrimental to the activity of these electron acceptor compounds.

Useful triarylimidazolyl dimers include those described in U.S. Pat. No. 4,963,471 (Trout et al.) at column 8, lines 18–28. These dimers include, for example, 2-(o-chlorophenyl)-4,5-bis(m-methoxyphenyl)-1,1'-biimidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred electron acceptor compounds include iodonium salts (more preferably, aryliodonium salts), chloromethylated triazines, triarylimidazolyl dimers (more preferably, 2,4,5-triphenylimidazolyl dimers), sulfonium salts, and diazonium salts. More preferred are aryliodonium salts, chloromethylated triazines, and the 2,4,5-triphenylimidazolyl dimers (with aryliodonium salts and the triazines being most preferred).

Preparation of Photoreactive Composition

The reactive species, multiphoton photosensitizers, electron donor compounds, and electron acceptor compounds can be prepared by the methods described above or by other methods known in the art, and many are commercially available. These components can be combined under "safe light" conditions using any order and manner of combination (optionally, with stirring or agitation), although it is sometimes preferable (from a shelf life and thermal stability standpoint) to add the electron acceptor compound last (and after any heating step that is optionally used to facilitate dissolution of other components). Solvent can be used, if desired, provided that the solvent is chosen so as to not react appreciably with the components of the composition. Suitable solvents include, for example, acetone, dichloromethane, and acetonitrile. The reactive species itself can also sometimes serve as a solvent for the other components.

The three components of the photoinitiator system are present in photochemically effective amounts (as defined above). Generally, the composition can contain at least about 5% (preferably, at least about 10%; more preferably, at least about 20%) up to about 99.79% (preferably, up to about 95%; more preferably, up to about 80%) by weight of one or more reactive species; at least about 0.01% (preferably, at least about 0.1%; more preferably, at least about 0.2%) up to about 10% (preferably, up to about 5%; more preferably, up to about 2%) by weight of one or more photosensitizers; optionally, up to about 10% (preferably, up to about 5%) by weight of one or more electron donor compounds (preferably, at least about 0.1%; more preferably, from about 0.1% to about 5%); and from about 0.1% to about 10% by weight of one or more electron acceptor compounds (preferably, from about 0.1% to about 5%) based upon the total weight of solids (that is, the total weight of components other than solvent).

A wide variety of adjuvants can be included in the photoreactive composition, depending upon the desired properties. Suitable adjuvants include solvents, diluents, resins, binders, plasticizers, pigments, dyes, inorganic or organic reinforcing or extending fillers (at preferred amounts of about 10% to 90% by weight based on the total weight of the composition), thixotropic agents, indicators, inhibitors, stabilizers, ultraviolet absorbers, medicaments (for example, leachable fluorides), toughening agents, abrasive granules, light stabilizers, antioxidants, flow agents, bodying agents, flatting agents, colorants, blowing agents, fungicides, bactericides, surfactants, glass and ceramic beads, reinforcing materials such as woven and non-woven webs of organic and inorganic fibers. and the like. The amounts and types of such adjuvants and their manner of addition to the composition will be familiar to those skilled in the art.

It is within the scope of this invention to include nonreactive polymeric binders in the composition in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly(methyl methacrylate), poly(styrene)-co-(acrylonitrile), cellulose acetate butyrate, and the like.

Prior to exposure, the resulting photoreactive composition can be, for example, cast or coated on a substrate, introduced or injected into a preformed cavity that approximates a desired three-dimensional shape, or pattern-coated in a form that approximates such a shape.

Exposure and Removal

Whereas single-photon absorption scales linearly with the intensity of incident radiation, two-photon absorption scales quadratically (and higher-order absorptions scale with a related higher power of incident intensity). As a result, it is possible to perform multiphoton processes with three-dimensional spatial resolution. Also, because multiphoton processes involve the simultaneous absorption of two or more photons, the absorbing chromophore is excited with a number of photons whose total energy equals the energy of a multiphoton absorption peak, even though each photon individually has insufficient energy to excite the chromophore. Because the exciting light is not attenuated by single-photon absorption within a curable matrix or material, it is possible to selectively excite molecules at a greater depth within a material than would be possible via single-photon excitation by use of a beam that is focused to that depth in the material.

Useful exposure systems for inducing multiphoton absorption include at least one light source (usually a pulsed laser) and at least one optical element. Suitable light sources include, for example, femtosecond near-infrared titanium sapphire oscillators (for example, a Coherent Mira Optima 900-F) pumped by an argon ion laser (for example, a Coherent Innova). This laser, operating at 76 MHz, has a pulse width of less than 200 femtoseconds, is tunable between 700 and 980 nm, and has average power up to 1.4 Watts. However, in practice, any light source that provides sufficient intensity (to effect multiphoton absorption) at a wavelength appropriate for the photosensitizer (used in the photoreactive composition) can be utilized. (Such wavelengths can generally be in the range of about 300 to about 1500 nm; preferably, from about 600 to about 1100 nm; more preferably, from about 750 to about 850 nm. Peak intensities can generally range from at least about $10^6$ W/cm$^2$. The upper limit of the pulse fluence is generally dictated by the ablation threshold of the photoreactive composition.) For example, Q-switched Nd:YAG lasers (for example, a Spectra-Physics Quanta-Ray PRO), visible wavelength dye lasers (for example, a Spectra-Physics Sirah pumped by a Spectra-Physics Quanta-Ray PRO), and Q-switched diode pumped lasers (for example, a Spectra-Physics FCbar™) can also be utilized. Preferred light sources are near infrared pulsed lasers having a pulse length less than about $10^{-8}$ second (more preferably, less than about $10^{-9}$ second; most preferably, less than about $10^{-11}$ second). Other pulse lengths can be used provided that the above-detailed peak intensity and pulse fluence criteria are met.

Optical elements useful in carrying out the method of the invention include refractive optical elements (for example, lenses and prisms), reflective optical elements (for example, retroreflectors or focusing mirrors), diffractive optical elements (for example, gratings, phase masks, and holograms), polarizing optical elements (for example, linear polarizers and waveplates), diffusers, Pockels cells, waveguides, waveplates, birefringent liquid crystals, and the like. Such optical elements are useful for focusing, beam delivery, beam/mode shaping, pulse shaping, and pulse timing. Generally, combinations of optical elements can be utilized, and other appropriate combinations will be recognized by those skilled in the art. It is often desirable to use optics with large numerical aperture to provide highly-focused light. However, any combination of optical elements that provides a desired intensity profile (and spatial placement thereof) can be utilized. For example, the exposure system can include a scanning confocal microscope (BioRad MRC600) equipped with a 0.75 NA objective (Zeiss 20x Fluar).

Generally, exposure of the photoreactive composition can be carried out using a light source (as described above) along with an optical system as a means for controlling the three-dimensional spatial distribution of light intensity within the composition. For example, the light from a pulsed laser can be passed through a focusing lens in a manner such that the focal point is within the volume of the composition. The focal point can be scanned or translated in a three-dimensional pattern that corresponds to a desired shape, thereby creating a three-dimensional image of the desired shape. The exposed or illuminated volume of the composition can be scanned either by moving the composition itself or by moving the light source (for example, moving a laser beam using galvo-mirrors).

Exposure times generally depend upon the type of exposure system used to cause image formation (and its accompanying variables such as numerical aperture, geometry of light intensity spatial distribution, the peak light intensity during the laser pulse (higher intensity and shorter pulse duration roughly correspond to peak light intensity)), as well as upon the nature of the composition exposed (and its concentrations of photosensitizer, electron acceptor compound, and electron donor compound). Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ second (preferably, about $10^{-11}$ to $10^{-14}$ second) and about $10^2$ to $10^9$ pulses per second (preferably, about $10^3$ to $10^8$ pulses per second).

If the light induces, for example, a reaction of the reactive species that produces a material having solubility characteristics different from those of the reactive species, the resulting image or structure can be developed by removing either the exposed or the unexposed regions through use of an appropriate solvent (such as an organic solvent or an aqueous base), for example, or by other art-known means. Such removal of solubilized material (or, when using reactive species that are curable, removal of uncured material) can be effected, for example, by using differential pressure (for example, by drawing a vacuum on an inlet or outlet of the structure, or by pressurizing (with a liquid or a gas) through an inlet or an outlet or both). The viscosity of the solubilized or uncured material can generally be sufficiently low to enable flow under useful differential pressures (for example, pressures of one to a few atmospheres). (Viscosity can be modified by the particular choice of reactive species, by the use of development solvents, by the use of selected temperature conditions, etc.) After removal of the solubilized or uncured material, the resulting article can be washed to remove any residual material, if desired. Cured, complex, planar or three-dimensional microfluidic articles can be prepared in this manner.

Preferred Processes

A preferred process for fabricating a microfluid processing architecture enclosed within a polymer matrix comprises (a) providing a photocurable composition capable of forming a polymer matrix upon exposure to light sufficient to cause multiphoton absorption, the composition comprising (1) a thermoplastic binder, (2) a curable species (preferably one that is capable of polymerization by addition polymerization), and (3) a photoinitiator system capable of initiating cure of the curable species upon simultaneous absorption of at least two photons; (b) exposing, in image-wise fashion, at least a portion of the photocurable composition with light sufficient to cause the photoinitiator system to absorb at least two photons, thereby curing at least a portion of the photocurable composition to form a polymer matrix having a three-dimensional pattern that defines a microfluid processing architecture, at least one inlet port, and at least one outlet port, wherein all walls or portions of the polymer matrix defining the microfluid processing architecture are formed by multiphoton absorption; and (c) removing uncured photocurable composition to create voids corresponding to the microfluid processing architecture. Preferably, the polymer matrix is in the form of a three-dimensional structure (for example, a monolith), rather than a thin sheet or film.

A second preferred process for fabricating a microfluid processing architecture having internal volume elements enclosed within a polymer matrix comprises (a) providing a polymer matrix; (b) exposing at least a portion of the polymer matrix to light sufficient to cause simultaneous absorption of at least two photons and render at least a portion of the polymer matrix removable to form a three-dimensional pattern corresponding to internal volume elements of a microfluid processing architecture capable of fluidic communication with at least one inlet port and at least one outlet port; and (c) removing the removable portion of the polymer matrix to create voids corresponding to the internal volume elements of the microfluid processing architecture. Preferably, the polymer matrix comprises a polymer having an acid labile linking group and a photoinitiator system capable of generating free acid upon simultaneous absorption of at least two photons. Preferably, the polymer matrix is in the form of a three-dimensional structure. The removable portion can be fluidized upon exposure to the light (that is, converted to a gas or a liquid), or it can be rendered soluble in a solvent and removed upon dissolving the removable portion in a solvent. Compositions capable of undergoing at least partial fluidization include, for example, solubilizable positive photoresist materials such as the water-insoluble organic compounds containing an acid-labile group that are described in U.S. Pat. No. 3,779,778 in columns 2–7.

A third preferred process for fabricating a microfluid processing architecture having a defined volume enclosed within a polymer matrix comprises (a) providing a curable composition capable of forming a polymer matrix upon exposure to energy and capable of being rendered uncurable by exposure to light sufficient to cause simultaneous absorption of at least two photons in the presence of a multiphoton photoinhibitor; (b) exposing at least a portion of the curable composition to light sufficient to cause the photoinhibitor to absorb at least two photons, thereby rendering at least a portion of the curable composition uncurable and forming a three-dimensional pattern that defines the volume of a microfluid processing architecture capable of fluidic communication with at least one inlet port and at least one outlet port; (c) exposing the curable composition to energy sufficient to cure the composition to form a polymer matrix; and (d) removing the uncurable portion of the composition to create voids corresponding to the microfluid processing architecture. Preferably, the curable composition comprises a thermoplastic binder, a curable species (preferably one that is capable of polymerization by addition polymerization), a photoinitiator system capable of causing polymerization of the curable species, and the multiphoton photoinhibitor (preferably, a species that inactivates the photoinitiator system). Preferably, the polymer matrix is in the form of a three-dimensional structure.

These three preferred processes preferably utilize photoinitiator systems that comprise preferred photosensitizers having a two-photon absorption cross-section greater than that of fluorescein (that is, greater than that of 3', 6'-dihydroxyspiro[isobenzofuran-1(3H), 9'-[9H]xanthen]3-one). Generally, the preferred cross-section can be greater than about $50 \times 10^{-50}$ cm$^4$ sec/photon, as measured by the method described by C. Xu and W. W. Webb in J. Opt. Soc. Am. B, 13, 481 (1996) (which is referenced by Marder and Perry et al. in International Publication No. WO 98/21521 at page 85, lines 18–22).

Microfluidic Articles

Figure 2:
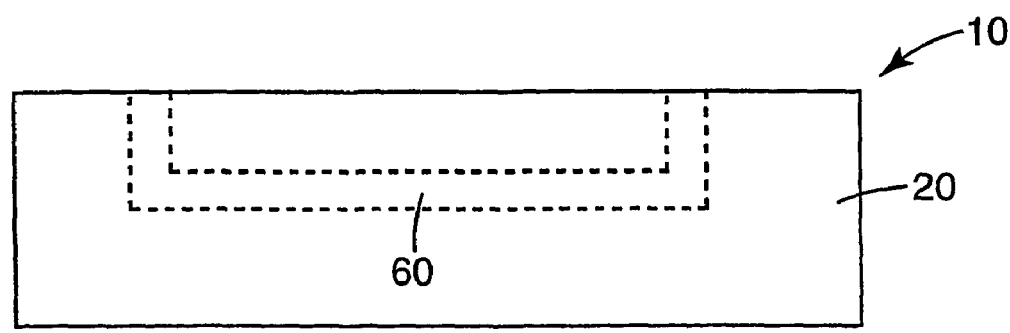

The process of the invention can be used to produce microfluidic articles having a variety of microfluid processing architectures. For example, FIGS. 1 and 2 show a simple embodiment 10 of a microfluidic article prepared by the process of the invention. The embodiment comprises a seamless polymeric matrix 20 that defines an inlet 30, a first outlet 40, a second outlet 50, and a microfluid processing architecture 60 that is capable of fluidic communication with the inlet and the outlets and that is otherwise fully enclosed within the polymer matrix. More complex microfluidic articles can also be prepared, as explained below. Microfluidic articles can be manufactured to perform numerous functions, including, for example, capillary array electrophoresis, kinetic inhibition assays, competition immunoassays, enzyme assays, nucleic acid hybridization assays, cell sorting, combinatorial chemistry, and electrochromatography.

The process of the invention can be used to produce one or more seamless polymeric portions of a microfluidic article. In such a case, other conventional processes (for example, those involving sealing with a cover plate) can be utilized for production of the remaining portions (for example, those portions for which seamlessness is less essential). The process can also be used to produce a seamless polymeric microfluidic article in its entirety, if seamlessness throughout the article is desired for a particular application.

A preferred microfluidic article comprises a microfluid processing architecture that is housed within a three-dimensional polymeric structure and that is in fluidic communication with one or more inlet ports and one or more outlet ports. The microfluid processing architecture is defined on all sides by walls of the polymeric structure formed by the process of the invention, without the need to adhere or fuse a cover plate to the structure. The microfluid processing architecture can be designed as a substantially planar arrangement of passageways or microchannels at a fixed depth within the structure. Alternatively, the architecture can comprise multiple layers of substantially planar fluid-handling passageways or microchannels that can be arranged at different depths within the structure without the need to adhere or fuse different structures together. These multiple layers can be in fluidic communication with one another by means of additional microfluidic channels that traverse from one plane to another within the structure. Optionally, the structure can comprise additional features, such as microelectronic, microoptical, and/or micromechanical elements (described further below), thereby providing design flexibility.

The process of the invention enables the preparation of microfluid processing architectures having high aspect ratio and variable aspect ratio features. This, in turn, provides articles exhibiting improved speed and resolution. For example, the depth of a microchannel can be varied while maintaining a constant microchannel width. Such microchannels can be used to construct vertically tapered inlet and outlet diffusers for a piezoelectric valve-less diffuser micropump, or can be used to provide electrokinetic zone control or electrokinetic focusing. Similarly, the width of a high aspect ratio microchannel can be tapered at constant depth. The resulting structure is also useful for providing electrokinetic zone control.

It is also possible to taper both the depth and width of the microchannels to provide a constant cross-sectional area or, alternatively, a constant cross-sectional perimeter. As a consequence of the constant cross-sectional area or perimeter, the resulting structure enables achievement of a constant voltage gradient throughout the length of the channel for predominantly electrophoretic flow or electroosmotic flow, thereby providing optical confinement for single molecule detection without loss of resolving power. This structure is also useful for providing a transition between low aspect ratio and high aspect ratio structures (for example, high aspect ratio injection tees, low aspect ratio probe capture zones, microwell reactors, or piezoelectric drive elements) without loss of electrokinetic resolving power.

It is also possible to prepare two intersecting microchannels having different depths. This feature, in turn, can be exploited to create a microfluidic switch in a hydrophobic substrate. Because of the depth difference, fluid in one arm of the relatively shallow microchannel will not cross the intersection unless a buffer is introduced into the relatively deeper microchannel to bridge the intersection. The variable depth feature is also useful for preparing post arrays for corralling probe capture beads in an immunoassay or nucleic acid assay, while simultaneously permitting the reporter reagent and fluid sample to flow freely.

It is also possible to selectively deposit reagents, biological probes, biocompatible coatings, and the like in various regions of the structure.

Preferred microfluidic articles further include one or more microelectronic, microoptical, and/or micromechanical elements. Examples of microelectronic elements include conductive traces, electrodes, electrode pads, microheating elements, electrostatically driven pumps and valves, microelectromechanical systems (MEMS), and the like. Examples of microoptical elements include optical waveguides, waveguide detectors, reflective elements (for example, prisms), beam splitters, lens elements, solid state light sources and detectors, and the like. Examples of micromechanical elements include filters, valves, pumps, pneumatic and hydraulic routing, and the like.

Such microelements can serve a variety of functions. For example, microelectronic elements that make contact with fluid at particular points in the microfluid processing architecture can be designed to electrokinetically drive fluids through the architecture with a high degree of control. Such microelectronic elements can enable operations such as electrokinetic injection, capillary electrophoresis, and isoelectric focusing, as well as more complex operations such as delivering precise amounts of reagents to one or more sample handling regions for applications such as capillary array electrophoresis and combinatorial chemistry.

It is also possible to design microelements that do not contact the fluid. For example, microelectronic elements can be designed to lie within the polymeric structure but in close proximity to the microfluid processing architecture, so that they can be used to heat and cool fluid samples or to establish different temperature zones throughout the microfluid processing architecture. Such zones, in turn, can be used to support the thermal cycling required in applications such as PCR (that is, polymerase chain reaction) amplification of nucleic acids and combinatorial chemistry experiments. In addition, microelectronic elements lying in close proximity to the microfluid processing architecture can be designed to form an antenna to detect AC (alternating current) impedance changes useful for detecting analytes in a microfluidic separation system.

EXAMPLES

Objects and advantages of this invention are further illustrated by the following examples, but the particular materials and amounts thereof recited in these examples, as well as other conditions and details, should not be construed to unduly limit this invention.

Preparation of N-{4-[(1E,3E)-4-(2,5-bis(decyloxy)-4-{(1E,3E)-4-[4-(dibutylamino)phenyl]buta-1,3-dienyl}phenyl)buta-1,3-dienyl]phenyl}-N,N-dibutylamine (Photosensitizer)

Synthesis of N,N-dibutylamino-cinnamoylaldehyde:

A 500 mL round bottom flask was charged with 4-bromo-N,N-dibutylaniline (10.18 g, 35.8 mmol) that was prepared according to literature procedures (Chemical and Pharmaceutical Bulletin, 1984, 32 (5), 1770–1779). The flask was then fitted with a calibrated dropping funnel, and the flask was flushed with $N_2$ and sealed with septa. Tetrahydrofuran (THF, 118 g) was cannulated into the flask, and the contents of the flask were magnetically stirred and cooled to −78° C. t-Butyllithium (50 mL, 1.7 M) was cannulated into the dropping funnel, and then it was slowly added to the stirred aniline solution over the course of 10 minutes. After the addition of the butyllithium was complete, the flask was stirred at −78° C. for 15 minutes and then it was allowed to warm and stir at ambient temperature for 30 minutes. The flask was then recooled to −78° C., and 3-(dimethylamino)acrolein (4.0 mL, 39.9 mmol) was added dropwise to the flask with stirring. The flask was allowed to stir and warm to ambient temperature overnight. Water (50 mL) was added, and the solution was mixed well. The resulting layers were separated, and the water was extracted with $Et_2O$ twice. The pooled organic layers were extracted once with saturated aqueous NaCl, dried over anhydrous sodium sulfate, filtered, and finally evaporated in vacuo to yield a red oil. $^1N$ NMR analysis was consistent with a cis/trans structure of a mixture of isomers, and the product was suitable for use directly in the next step.

Synthesis of 1,4-didecyloxybenzene:

A 3 liter round bottom flask was charged with hydroquinone (75 g, 0.681 moles), bromodecane (461 g, 2.08 moles), potassium carbonate (290 g, 2.09 moles), and acetonitrile (1500 mL). The flask was fitted with a mechanical stirrer and two reflux condensers. The flask was heated with stirring under nitrogen for 3 days. The flask was allowed to cool to ambient temperature, and water (2 liters) was added. The resulting solids were broken up by being shaken with water. The collected solids were air dried and then dissolved in hot heptane (2000 mL). The hot clear heptane solution was added to $CH_3OH$ (3 liters), and a colorless flocculant solid formed. The solid was collected, air dried and was suitable for use directly in the next step. $^1H$ NMR was consistent with the proposed structure.

Reaction of 1,4-bis-bromomethyl-2,5-didecyloxybenzene with triethyl phosphite:

1,4-bis-bromomethyl-2,5-didecyloxybenzene was prepared according to the literature procedure (Syper et. al., Tetrahedron, 1983, 39, 781–792), with the modification that 1,4-didecyloxybenzene was used in place of 1,4-dimethoxybenzene. 1,4-bis-bromomethyl-2,5-didecyloxybenzene (253 g, 0.78 mol) was placed into a 1000 mL round bottom flask. Triethyl phosphite (300 g, 2.10 mol) was added. The reaction mixture was heated to vigorous reflux with stirring for 48 hours under a nitrogen atmosphere. The reaction mixture was cooled, and excess $P(OEt)_3$ was removed under vacuum using a Kugelrohr apparatus. The desired product was not actually distilled, but the Kugelrohr was used to remove the excess P(OEt)$_3$ by distilling it away from the product. Upon heating to 100° C. at 0.1 mmHg, a clear oil resulted. Upon cooling, the desired product solidified. The product was suitable for use directly in the next step, and $^1$H NMR was consistent with the proposed structure. Recrystallization from toluene yielded colorless needles and resulted in a purer product, but this was not necessary for subsequent steps in most cases.

Synthesis of Final Product:

A 1000 mL round bottom flask was fitted with a calibrated dropping funnel and a magnetic stirrer. The flask was charged with the Horner Eamons reagent as prepared above (11 g, 15.9 mmol) and with N,N-dibutylamino-cinnamoy-laldehyde (9.4 g, 36 mmol). The flask was flushed with nitrogen and sealed with septa. Anhydrous tetrahydrofuran (THF, 500 mL) was cannulated into the flask and all solids dissolved. The dropping funnel was charged with KOtBu (40 mL, 1.0 M in THF). The solution in the flask was stirred, and the KOtBu solution was added to the contents of the flask over the course of 30 minutes. The solution was then left to stir at ambient temperature overnight. The reaction mixture was then quenched by the addition of H$_2$O (250 mL). The reaction mixture continued to stir and after about 30 minutes a highly fluorescent yellow solid had formed in the flask. The solid was isolated by filtration and air-dried. It was then recrystallized from toluene (450 mL). The desired product was obtained as fluorescent needles (5.75 g, 47% yield). $^1$H NMR was consistent with the proposed structure.

Example 1

A pattern of two crossed channels with circular wells at each end is prepared by laser ablation in polyimide (Kapton™ from DuPont, Wilmington, Del.). This pattern is replicated by electroforming in nickel to create a metal stamper with ridges. This stamper is then used to emboss a sheet of polycarbonate (Lexan™, from GE Plastic, Pittsfield, Mass.) to create crossed channels. Examination of these channels with trapezoidal cross section by optical microscopy reveals a depth of 50 microns, a width of 55 microns at the bottom, and a width of 79 microns at the top. The arms of the cross have lengths of 16, 8, 4 and 8 mm, and the well at each arm's end has a diameter of about 5 mm. This pattern of crossed channels is covered by a layer of # 375 box sealing tape (having a Kraton™ rubber-based adhesive and a polypropylene backing; available from 3M, St. Paul, Minn.).

A photoreactive composition in the form of a fluid solution is prepared by mixing 0.5% of N-{4-[(1E,3E)-4-(2,5-bis(decyloxy)-4-{(1E,3E)-4-[4-(dibutylamino)phenyl]buta-1,3-dienyl}phenyl)buta-1,3-dienyl]phenyl}-N,N-dibutylamine (prepared as described above), 2% tetrabutylammonium n-hexyl-tris(3-fluorophenyl)borate (available as CGI 437 and CGI 746 from Ciba Specialty Chemicals Corporation), and 2% diaryliodonium hexafluoroantimonate (for example, SarCat™ SR 1012 available from Sartomer Company) in a mixture of 2 parts trimethylolpropane triacrylate and 1 part tetrahydrofurfuryl acrylate (SR 351 and SR 285, respectively, available from Sartomer Company). A small amount of this composition is applied to the well at one end of the longer arm, and it wicks by capillary action the length of the arm. The resulting sample is mounted to a glass slide and placed on a computer-controlled precision stage. Exposure is performed using a two-photon microscope incorporating a Spectra-Physics, Inc., MaiTai™ model Ti:Sapphire laser operating at 80 MHz with a pulse width of about 100 fs. The wavelength used is 800 nm, the power is 20 mW, and the light is focused through an objective (60×) with NA=0.85. The stage is moved in such a way that portions of the composition are exposed so as to cure and form a bottom layer, walls, and a top layer. After exposure, uncured composition is removed by gently applying air pressure at one end of the channel, thereby expelling the uncured composition out the other end. The resulting empty channel is rinsed twice with isopropanol by wicking it in and expelling it with air pressure. The result is a tube lined with the cured polymer composition on all sides (a microfluidic article comprising a seamless polymer matrix). The tube has a nominal diameter (measured by microscopy) of about 20 microns.

Example 2

This example describes the preparation of a microfluidic article featuring two orthogonal intersecting channels that are encapsulated within a polymethylmethacrylate polymer host. Such structures are useful in performing electrophoresis separations.

Microfabrication is performed in solid samples consisting of 30% w/w polymer binder (polymethylmethacrylate (PMMA)) (120K, Aldrich Chemical Co., Milwaukee, Wis.), 69.9% w/w reactive monomer, and 0.1% w/w dye 1,4-bis(bis(dibutylamino)styryl)-2,5-dimethoxybenzene (which can be prepared as described by Marder and Perry in Example 62 of International Patent Publication No. WO 98/21521) in dioxane solvent. The monomer portion is 50% Sartomer SR9008™ (trimethylolpropane poly(ethoxy)triacrylate) and 50% SR368™ (an isocyanate triacrylate), both of which are available from Sartomer Corp., Exton, Pa. Solutions of this composition are prepared in dioxane such that the PMMA concentration is 200 mg/ml to obtain the proper viscosity. The solution is placed in a PMMA mold that is 5 cm wide, 7 cm long and 3 mm deep such that the wet thickness is about 2 mm. Dioxane is evaporated leaving a dry film thickness of 500 µm.

Exposure is performed using a two-photon microscope incorporating a Ti:Sapphire laser operating at 75 MHz with a pulse-width of about 150 fs. The wavelength used is 730 nm, and the light is focused through an oil immersion objective with NA=1.4. X-Y-Z control of the sample is accomplished using a computer-controlled manipulator mounted on the microscope stage. The focal point of the microscope is raster scanned in the X-Y plane at successive depths into the film, starting at the bottom of the film and working upward. For depths in the range of 0–200 um, the entire X-Y plane is irradiated. For the depth of 200 to 250 µm, the X-Y plane is irradiated except in regions where the microfluid channels are desired. For depths of 250 µm to the top surface, the entire X-Y plane is irradiated except for a 500 µm diameter reservoirs centered above the termini of the two channels (four circles in all).

The resulting article is cured except in the regions where the channels and reservoirs are desired. In this example, the two intersection channels are 50 µm deep and 50 µm wide. One channel is 28.5 mm long, and the other channel is 9 mm long. At this stage, the channels are completely encapsulated and filled with uncured material. The material in the channels and reservoirs is removed by washing with dimethylformamide (DMF) using differential pressure to move the fluids through the channels. The features are characterized by optical microscopy for the channels filled with air or filled with an aqueous solution of calorimetric indicator.

Example 3

Example 2 is repeated, except that no polymer binder (PMMA) is used (and the amounts of the other components of the composition are adjusted accordingly).

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A process for producing microfluidic articles comprising the steps of
   (a) preparing a photoreactive composition comprising
      (1) at least one reactive species that is a polymer or a polymer precursor and that is capable of undergoing an acid- or radical-initiated chemical reaction and
      (2) at least one multiphoton photoinitiator system comprising photochemically effective amounts of (i) at least one multiphoton photosensitizer that is capable of simultaneously absorbing at least two photons, (ii) optionally, at least one electron donor compound different from the multiphoton photosensitizer and capable of donating an electron to an electronic excited state of the photosensitizer, and (iii) at least one electron acceptor compound that is capable of being photosensitized by accepting an electron from an electronic excited state of the photosensitizer, resulting in the formation of at least one free radical and/or acid;
   (b) exposing a portion of said composition to light sufficient to cause simultaneous absorption of at least two photons, thereby forming exposed and unexposed portions of said composition, and thereby inducing at least one acid- or radical-initiated chemical reaction in said exposed portion; and
   (c) removing either said exposed or said unexposed portion of said composition, so as to form a microfluidic article comprising a seamless polymer matrix that defines at least one inlet, at least one outlet, and a microfluid processing architecture that is capable of fluidic communication with said inlet and said outlet and that is otherwise fully enclosed within said polymer matrix.

2. The process of claim 1 wherein said reactive species is a polymer precursor.

3. The process of claim 2 wherein said polymer precursor is selected from the group consisting of addition-polymerizable monomers and oligomers, cationically-polymerizable monomers and oligomers, and mixtures thereof.

4. The process of claim 3 wherein said monomers and oligomers are addition-polymerizable.

5. The process of claim 1 wherein said reactive species is selected from the group consisting of addition-polymerizable monomers and oligomers, addition-crosslinkable polymers, cationically-polymerizable monomers and oligomers, cationically-crosslinkable polymers, and mixtures thereof.

6. The process of claim 1 wherein said multiphoton photosensitizer has a two-photon absorption cross-section greater than that of fluorescein.

7. The process of claim 1 wherein said multiphoton photosensitizer has a two-photon absorption cross-section greater than about $50 \times 10^{-50}$ cm$^4$ sec/photon.

8. The process of claim 1 wherein said multiphoton photosensitizer is Rhodamine B or a compound selected from the following group of compounds:

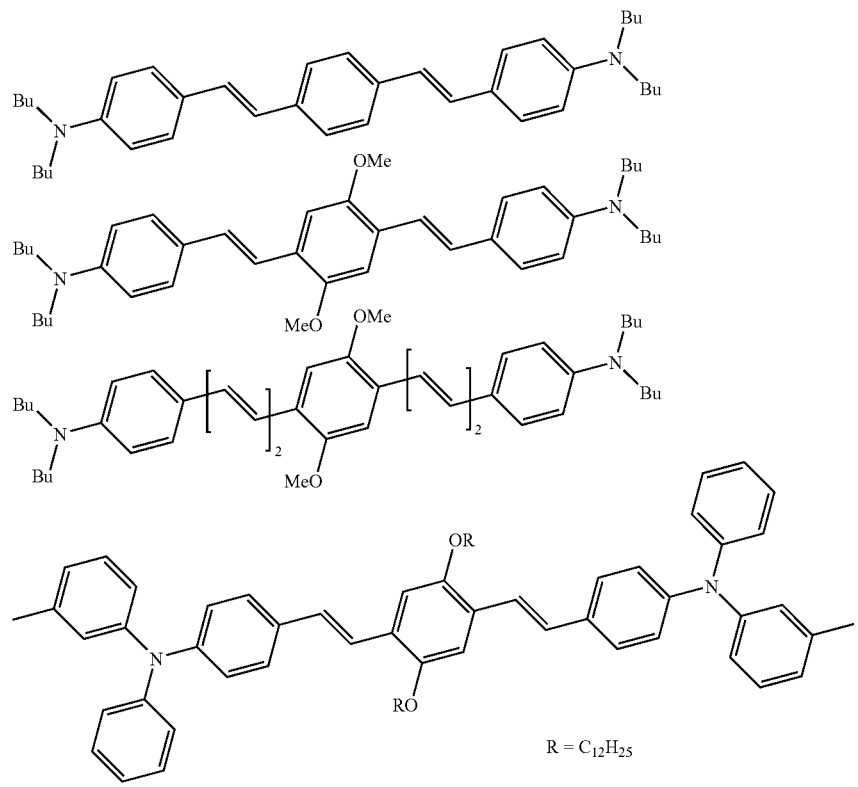

R = C$_{12}$H$_{25}$

-continued
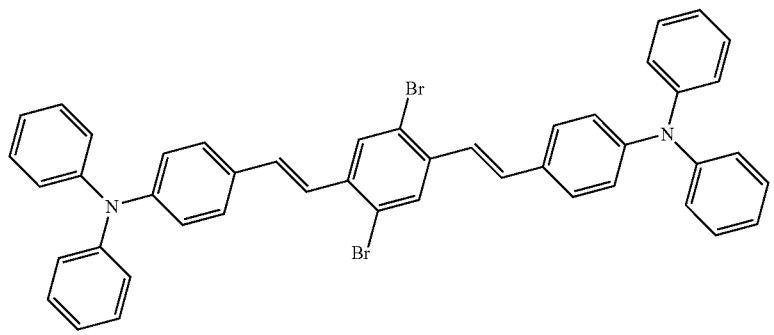
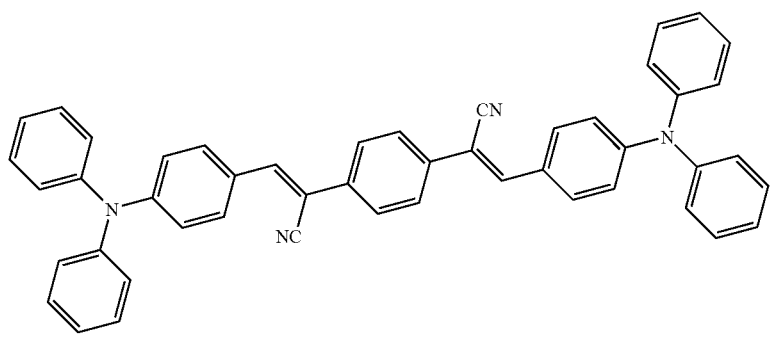
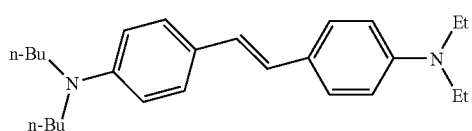
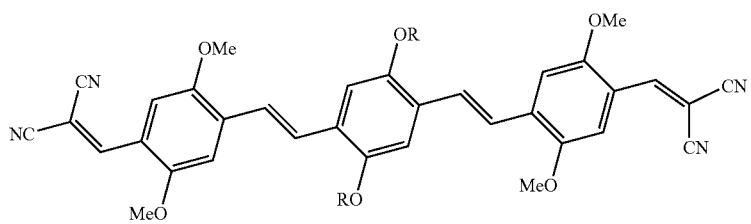
R = C₁₂H₂₅
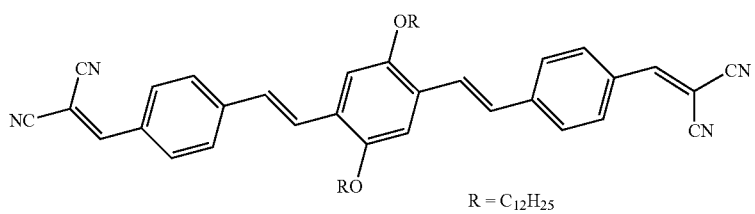
R = C₁₂H₂₅
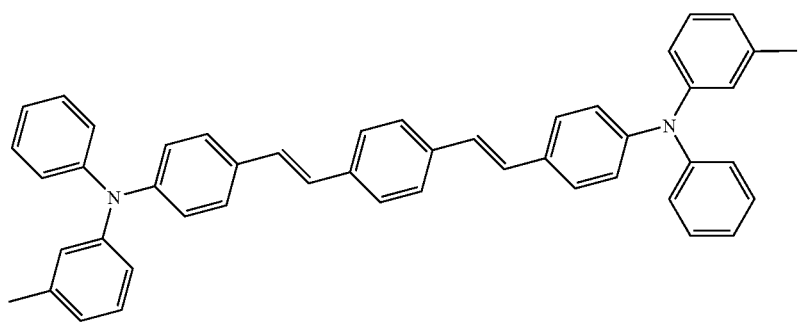

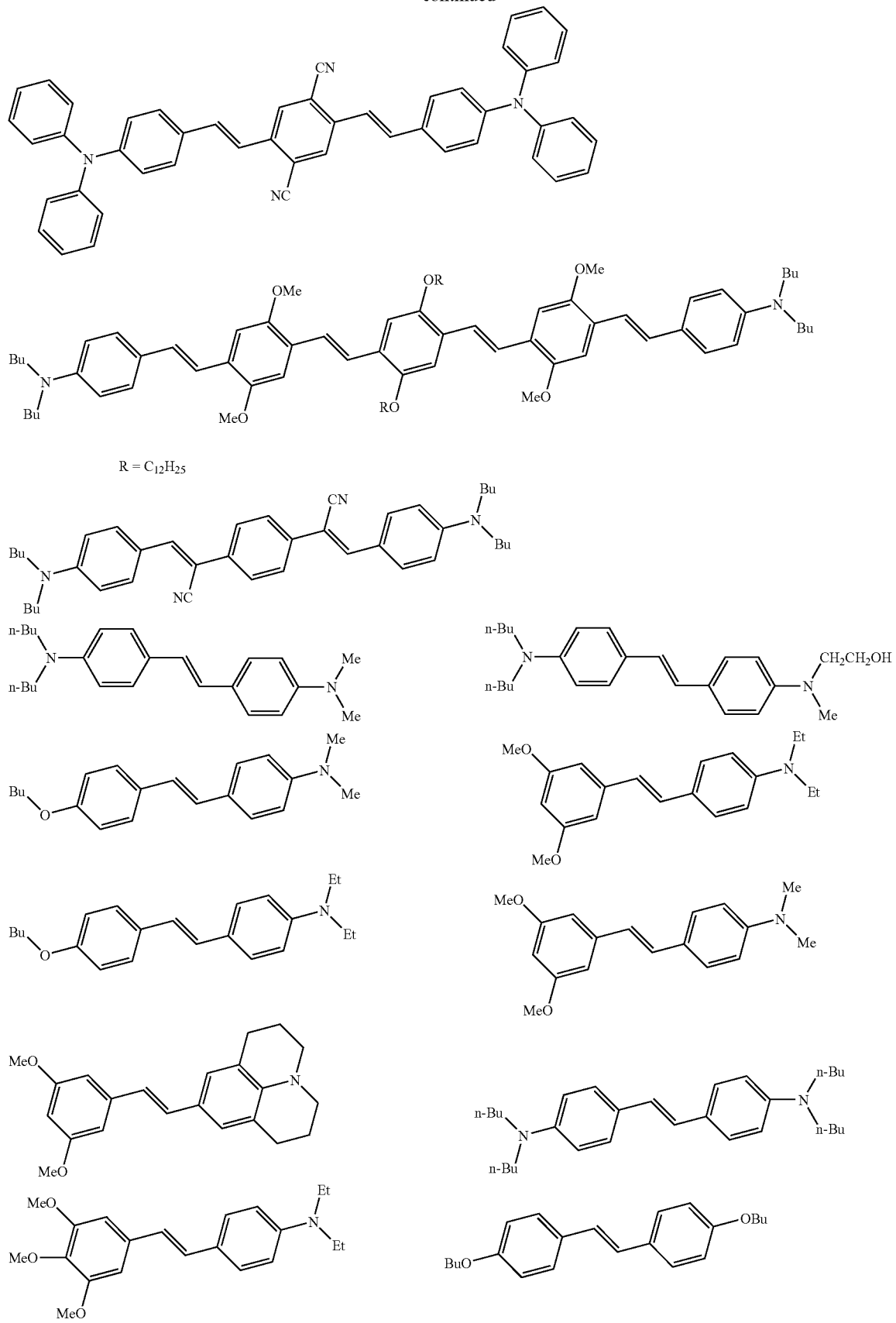

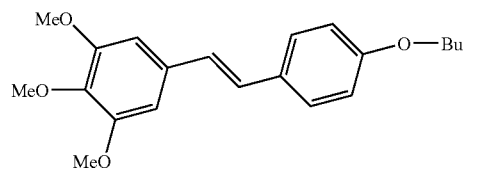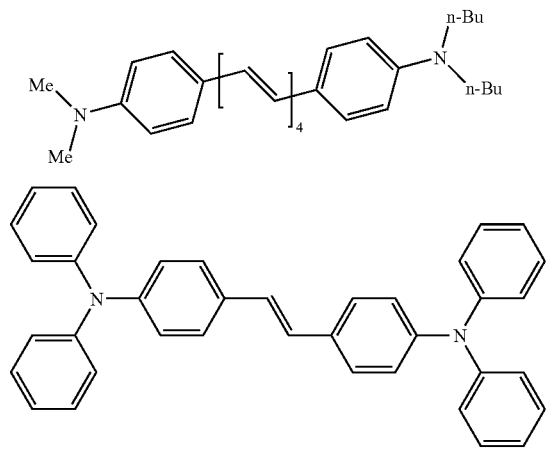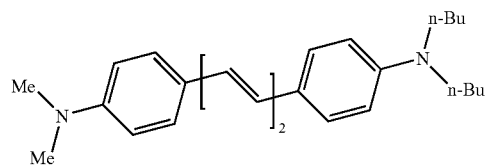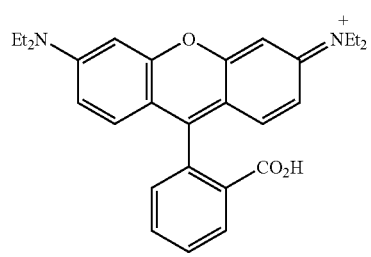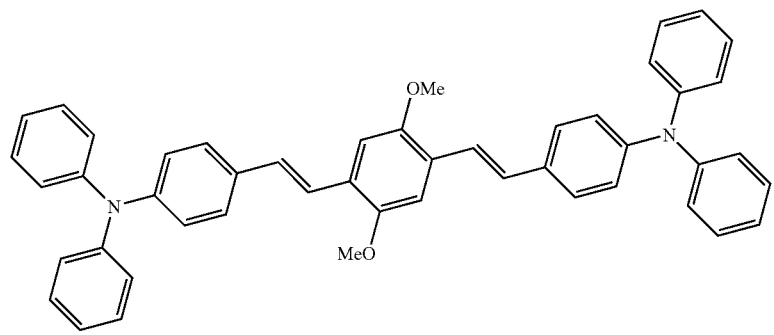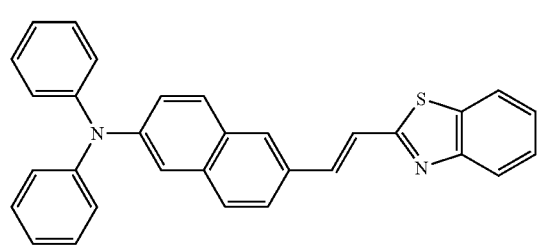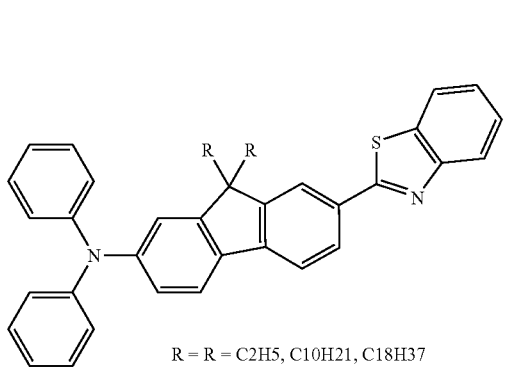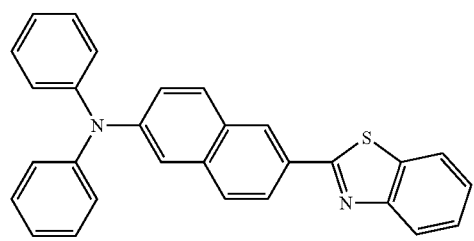

-continued
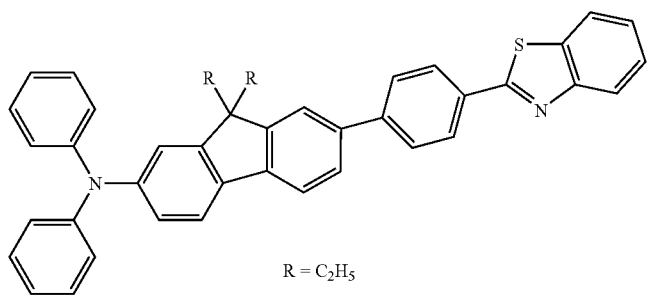
R = C$_2$H$_5$
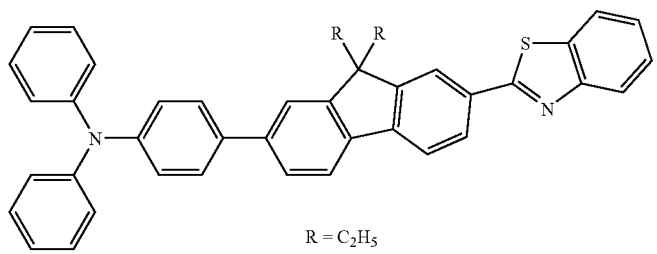
R = C$_2$H$_5$
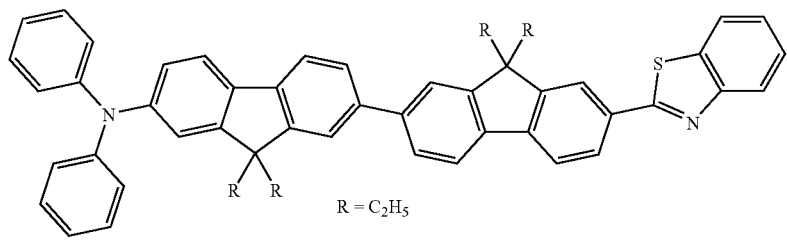
R = C$_2$H$_5$
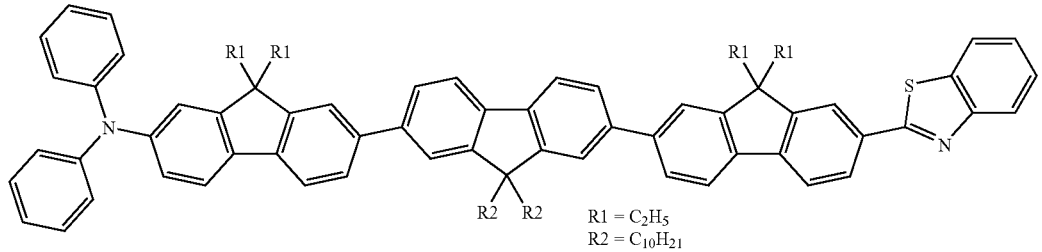
R1 = C$_2$H$_5$
R2 = C$_{10}$H$_{21}$
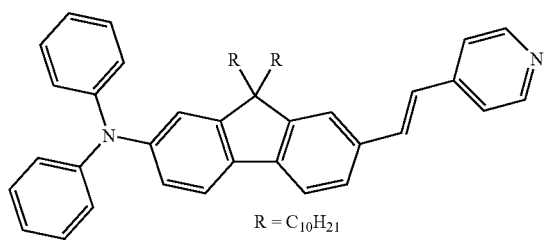
R = C$_{10}$H$_{21}$
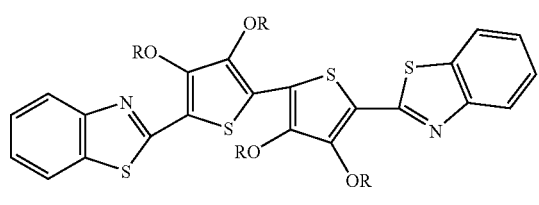
R = C$_{10}$H$_{21}$
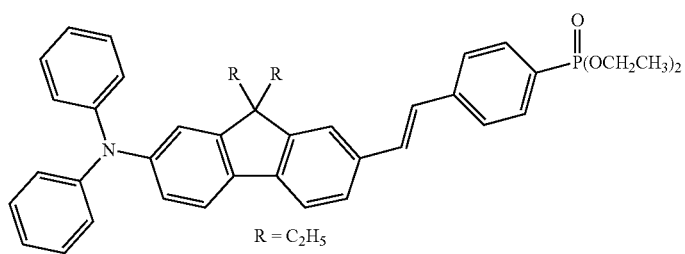
R = C$_2$H$_5$ -continued
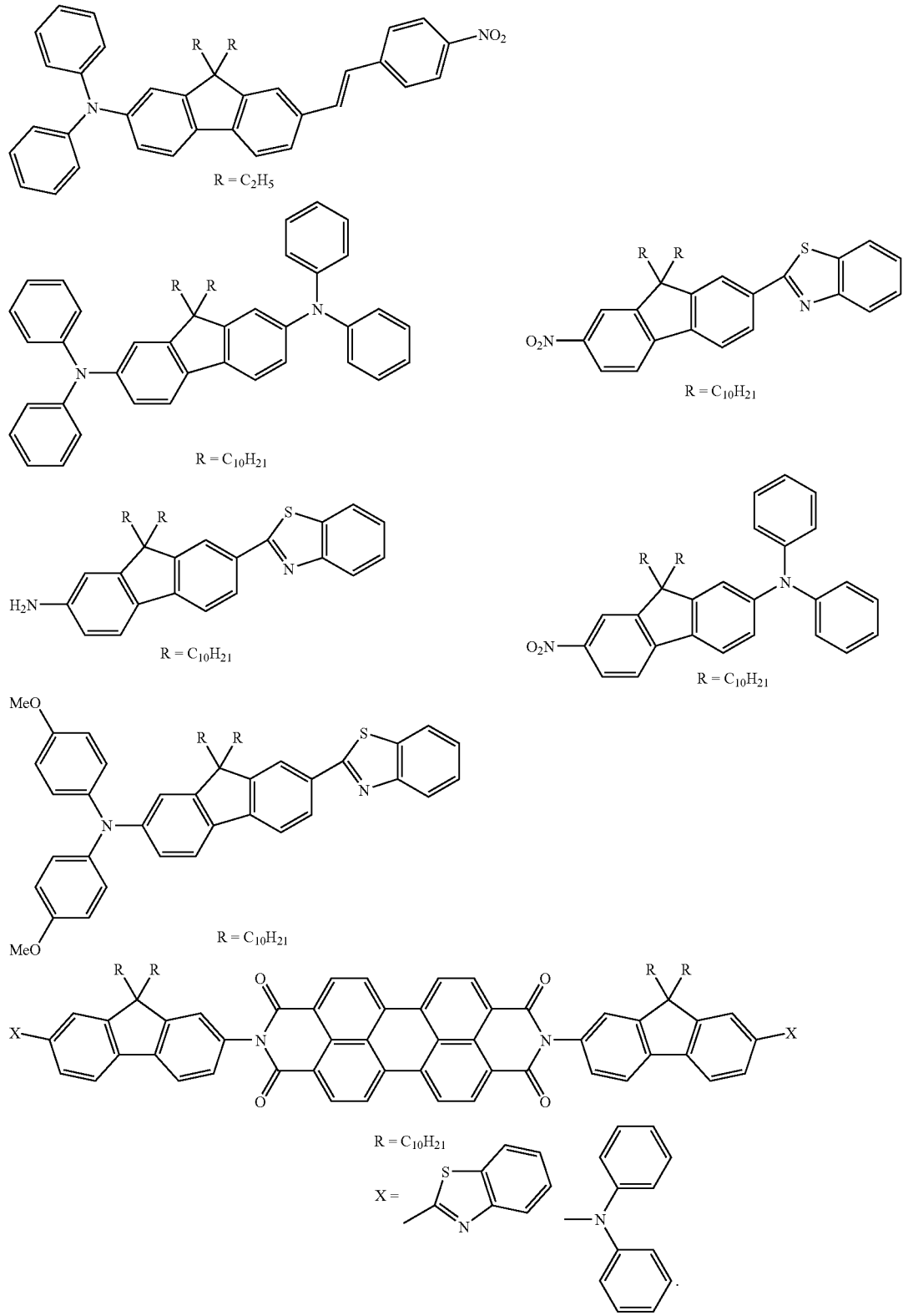
9. The process of claim 1 wherein said electron donor compound has an oxidation potential that is greater than zero and less than or equal to that of p-dimethoxybenzene.
10. The process of claim 1 wherein said electron donor compound has an oxidation potential between about 0.3 and 1 volt vs. a standard saturated calomel electrode.

11. The process of claim 1 wherein said electron donor compound is selected from the group consisting of amines, amides, ethers, ureas, sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$borates (n+m=4), $SnR_4$ compounds (where each R is independently chosen from the group consisting of alkyl, aralkyl, aryl, and alkaryl groups), ferrocene, and mixtures thereof.

12. The process of claim 11 wherein said electron donor compound is selected from the group consisting of amines that contain one or more julolidinyl moieties, alkylarylborate salts, salts of aromatic sulfinic acids, 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, 1,2,4-trimethoxybenzene, and mixtures thereof.

13. The process of claim 1 wherein said photoreactive composition contains no electron donor compound.

14. The process of claim 1 wherein said electron acceptor compound is selected from the group consisting of iodonium salts, sulfonium salts, diazonium salts, azinium salts, chloromethylated triazines, triarylimidazolyl dimers, and mixtures thereof.

15. The process of claim 14 wherein said electron acceptor compound is selected from the group consisting of iodonium salts, chloromethylated triazines, triarylimidazolyl dimers, sulfonium salts, diazonium salts, and mixtures thereof.

16. The process of claim 15 wherein said electron acceptor compound is selected from the group consisting of aryliodonium salts, chloromethylated triazines, 2,4,5-triphenylimidazolyl dimers, and mixtures thereof.

17. The process of claim 1 wherein said photoreactive composition comprises from about 5% to about 99.79% by weight of said at least one reactive species, from about 0.01% to about 10% by weight of said at least one multiphoton photosensitizer, up to about 10% by weight of said at least one electron donor compound, and from about 0.1% to about 10% by weight of said at least one electron acceptor compound, based upon the total weight of solids.

18. The process of claim 1 wherein said photoreactive composition further comprises at least one adjuvant selected from the group consisting of solvents, diluents, resins, binders, plasticizers, pigments, dyes, inorganic or organic reinforcing or extending fillers, thixotropic agents, indicators, inhibitors, stabilizers, ultraviolet absorbers, and medicaments.

19. The process of claim 1 wherein said exposing is by pulse irradiating.

20. The process of claim 19 wherein said pulse irradiating is carried out using a near infrared pulsed laser having a pulse length less than about $10^{-8}$ second.

21. The process of claim 1 wherein said process provides linear imaging speeds of about 5 to about 100,000 microns/second using a laser pulse duration of about $10^{-8}$ to $10^{-15}$ second and about $10^2$ to $10^9$ pulses per second.

22. A process for producing microfluidic articles comprising the steps of
(a) preparing a photoreactive composition comprising
(1) at least one reactive species that is a polymer precursor and that is capable of undergoing a radical-initiated or acid-initiated chemical reaction and
(2) at least one multiphoton photoinitiator system comprising photochemically effective amounts of
(i) Rhodamine B,
(ii) optionally, at least one alkylarylborate salt, and
(iii) at least one iodonium salt;
(b) exposing a portion of said composition to light sufficient to cause simultaneous absorption of at least two photons, thereby forming exposed and unexposed portions of said composition, and thereby inducing at least one radical-initiated chemical reaction in said exposed portion; and
(c) removing either said exposed or said unexposed portion of said composition, so as to form a microfluidic article comprising a seamless polymer matrix that defines at least one inlet, at least one outlet, and a microfluid processing architecture that is capable of fluidic communication with said inlet and said outlet and that is otherwise fully enclosed within said polymer matrix.

23. A microfluidic article prepared by the process of claim 1 or claim 22.

24. The microfluidic article of claim 23 wherein said article comprises a microfluid processing architecture that is arranged in a substantially planar configuration at a fixed depth within said article.

25. The microfluidic article of claim 23 wherein said article comprises two or more substantially planar microfluid processing architectures arranged at different depths within said article.

26. The microfluidic article of claim 25 wherein said two or more microfluid processing architectures are in fluidic communication with one another.

27. The microfluidic article of claim 23 wherein said article is seamless.

* * * * *